United States Patent
Ammo et al.

(10) Patent No.: US 6,323,075 B1
(45) Date of Patent: Nov. 27, 2001

(54) METHOD OF FABRICATING SEMICONDUCTOR DEVICE

(75) Inventors: Hiroaki Ammo, Kanagawa; Hiroyuki Miwa, Tokyo, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/583,279

(22) Filed: May 31, 2000

(30) Foreign Application Priority Data

May 31, 1999 (JP) .................................................. 11-152103

(51) Int. Cl.⁷ .................... H01L 21/8238; H01L 21/8249
(52) U.S. Cl. .......................... 438/202; 438/203; 438/234; 438/321
(58) Field of Search ..................... 438/301, 312, 438/320, 222, 322, 321, 313, 336, 341, 202, 203, 234; 257/511, 513–515, 525, 587, 588

(56) References Cited

U.S. PATENT DOCUMENTS

| | | | |
|---|---|---|---|
| 5,059,549 | * 10/1991 | Furuhata | 438/234 |
| 5,196,356 | * 3/1993 | Won et al. | 438/203 |
| 5,290,714 | * 3/1994 | Onozawa | 438/207 |
| 6,022,778 | * 2/2000 | Contiero et al. | 438/268 |
| 6,066,521 | * 5/2000 | Yokoyama et al. | 438/202 |

FOREIGN PATENT DOCUMENTS

1271566 * 7/1990 (CA) ........................................ 21/27

* cited by examiner

Primary Examiner—Charles Bowers
Assistant Examiner—Brook Kebede
(74) Attorney, Agent, or Firm—Sonnenschein, Nath & Rosenthal

(57) ABSTRACT

Disclosed is a method of fabricating a semiconductor device in which at least an LDD type insulated-gate field effect transistor and a bipolar transistor are formed on a common base substrate. An insulating layer for forming side walls of an LDD type insulated-gate field effect transistor is formed by a stack of first and second insulating films. An opening is formed in the lower first insulating film at a position in a bipolar transistor forming area, and a single crystal semiconductor layer is formed on a base substrate through the opening. With this configuration, the fabrication steps can be simplified and the reliability of the semiconductor device can be enhanced.

20 Claims, 18 Drawing Sheets

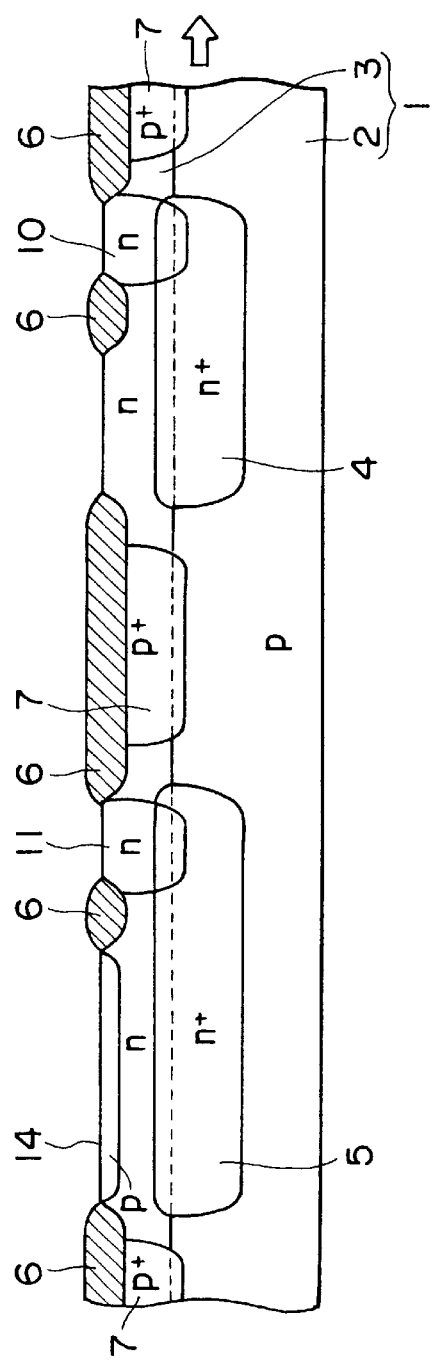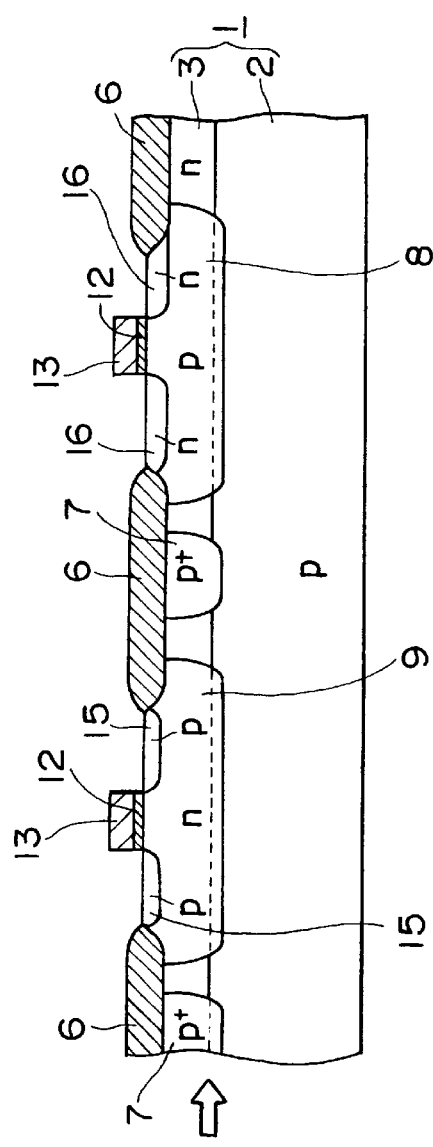
FIG. 1A
FIG. 1B

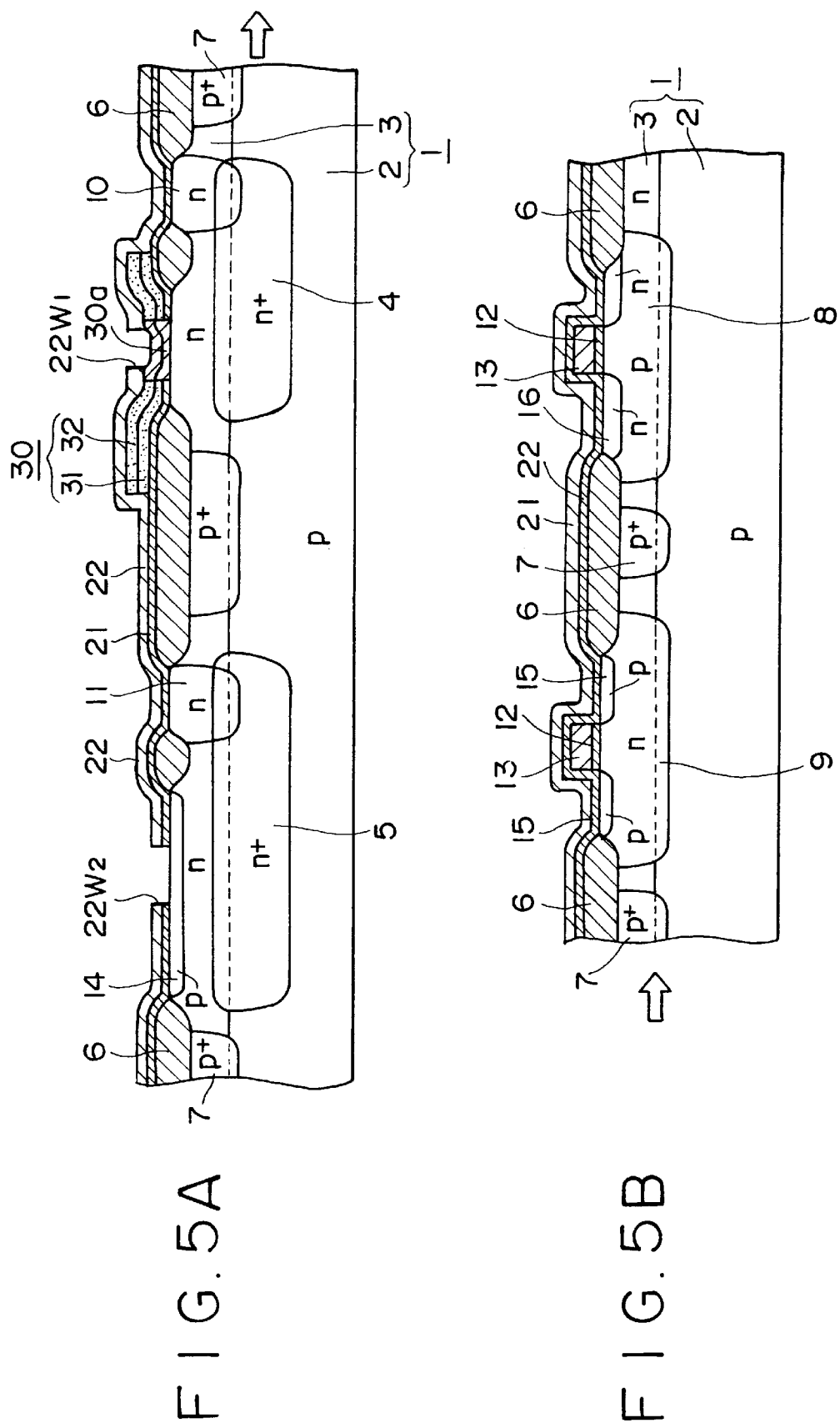

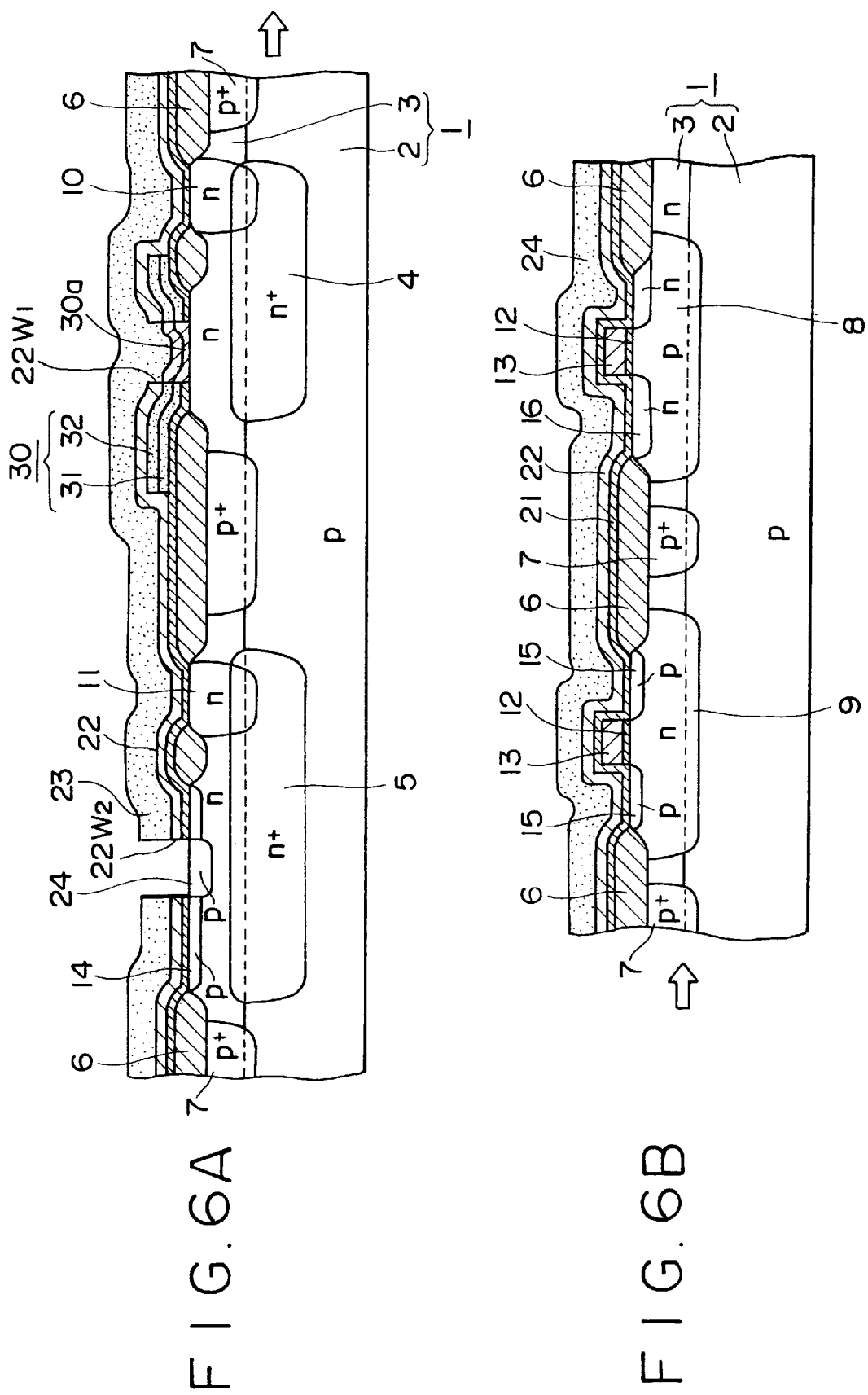

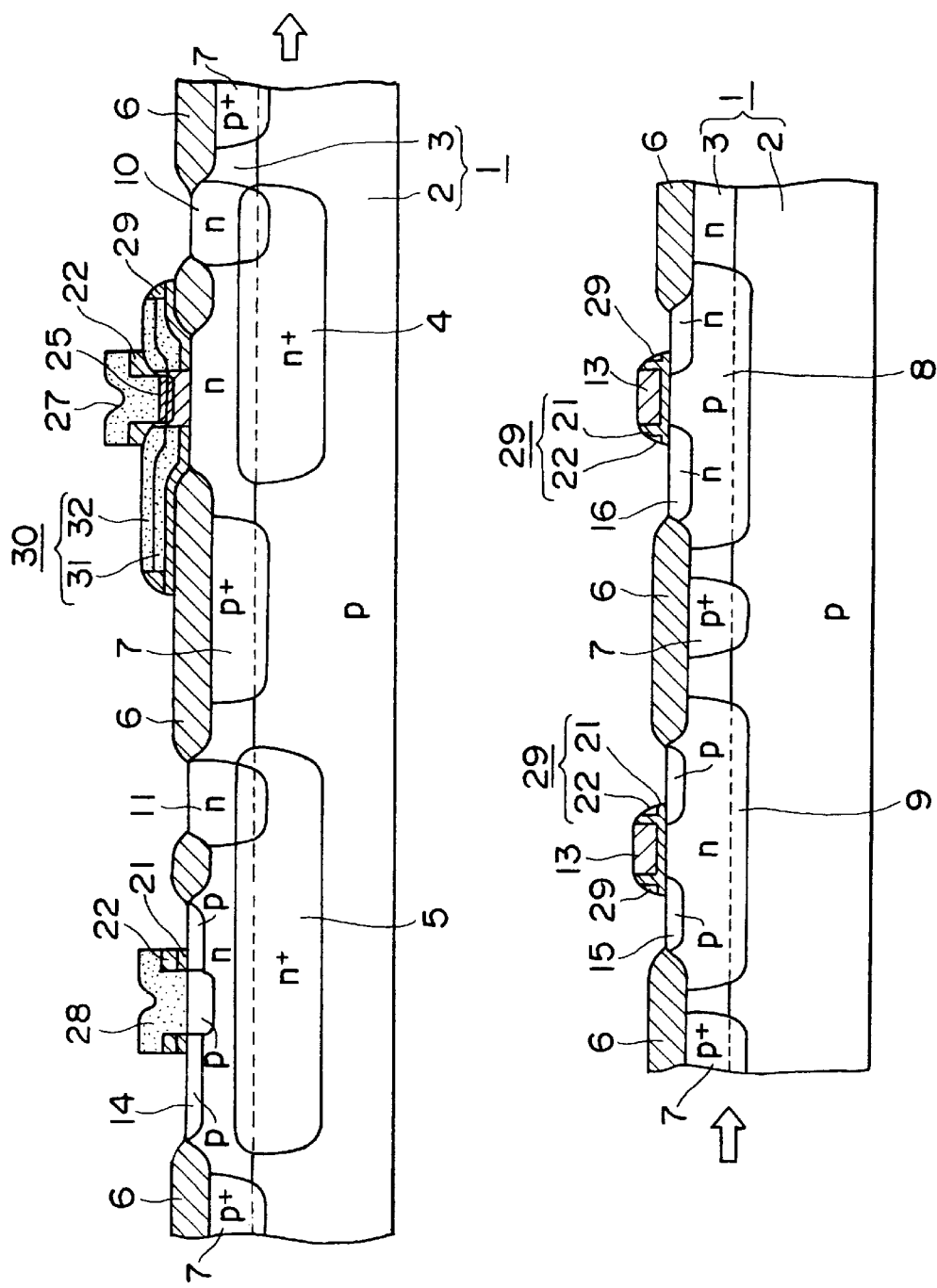

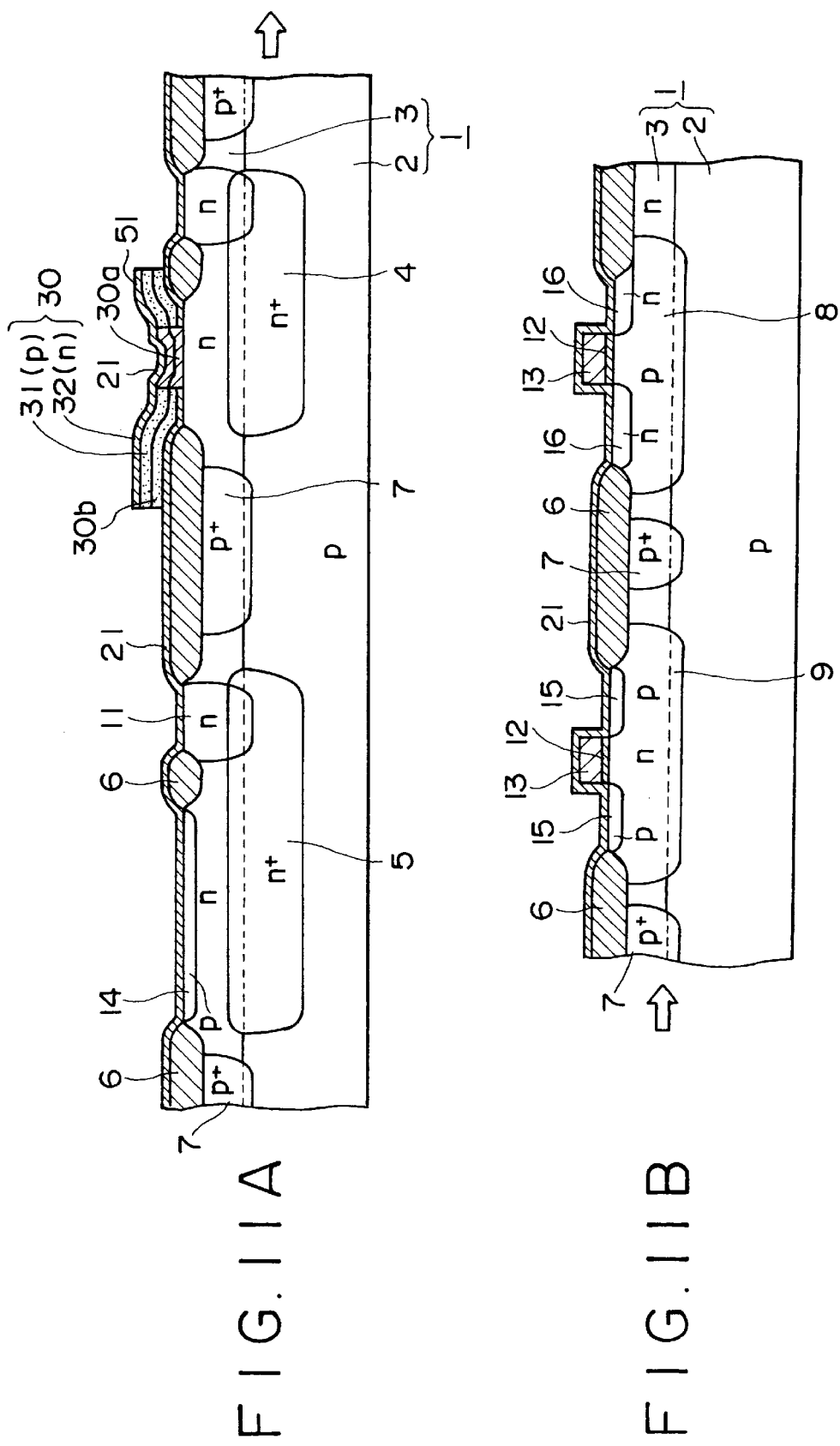

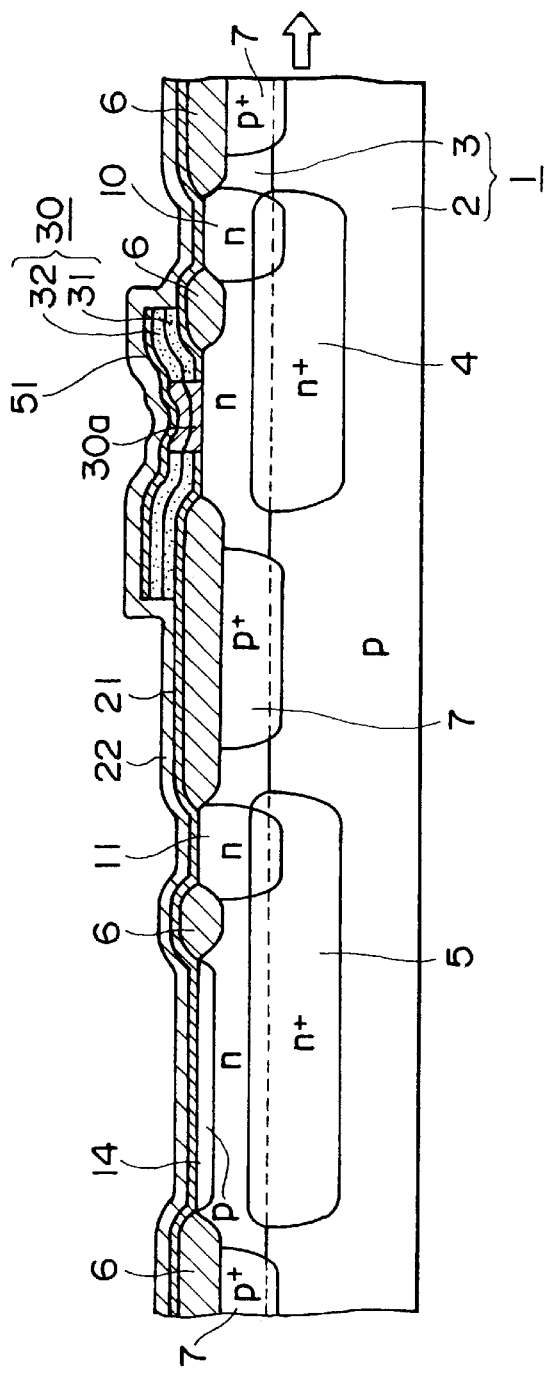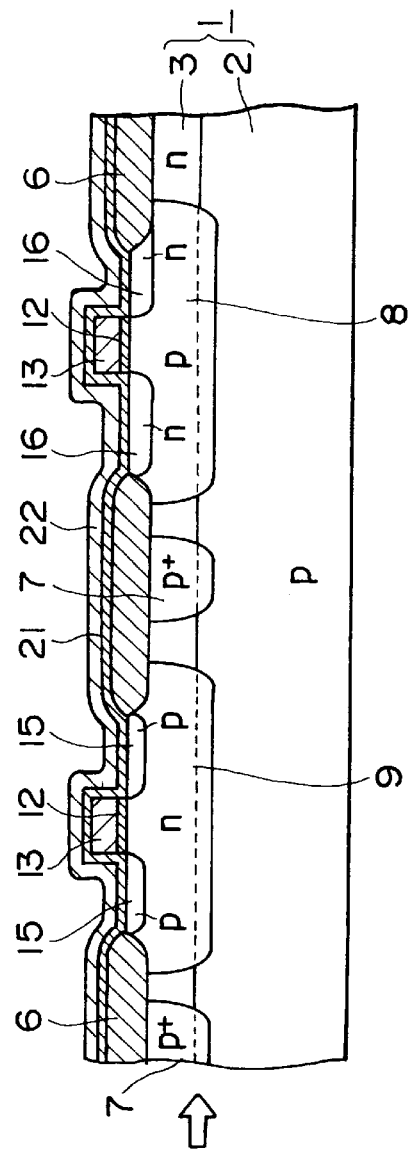
FIG.12A
FIG.12B

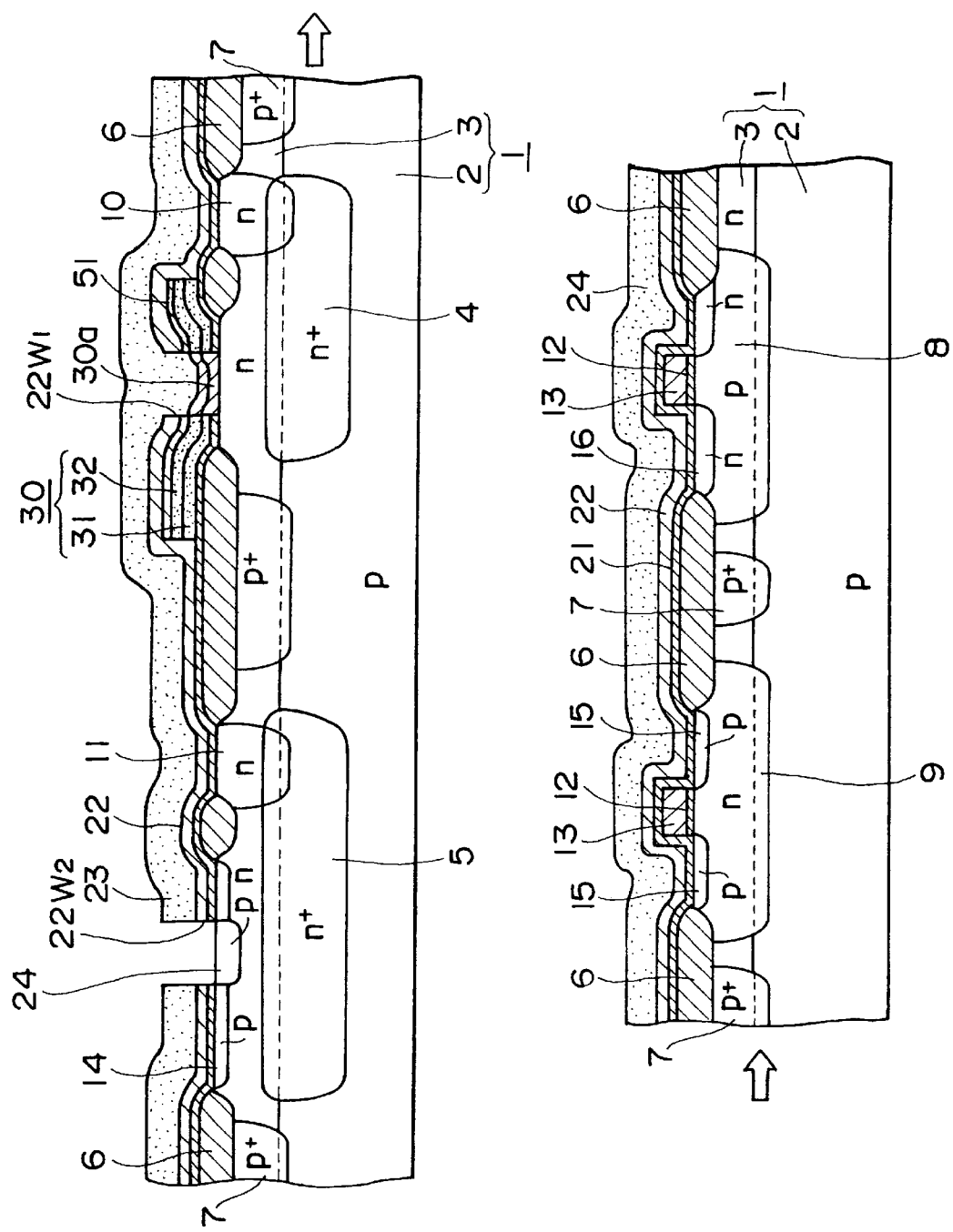

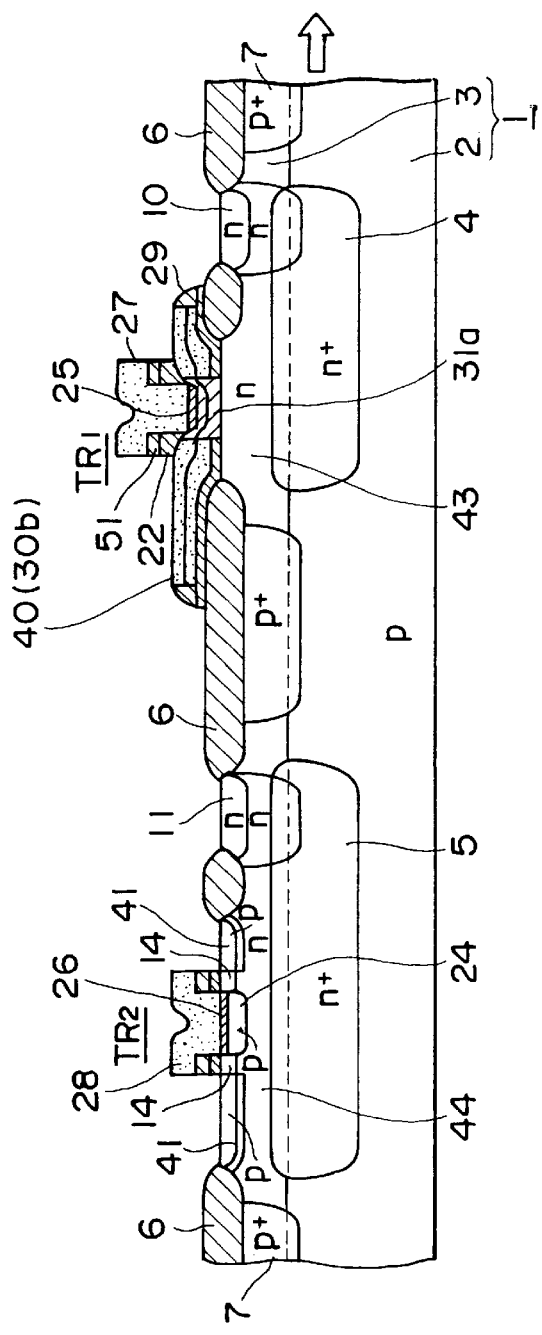
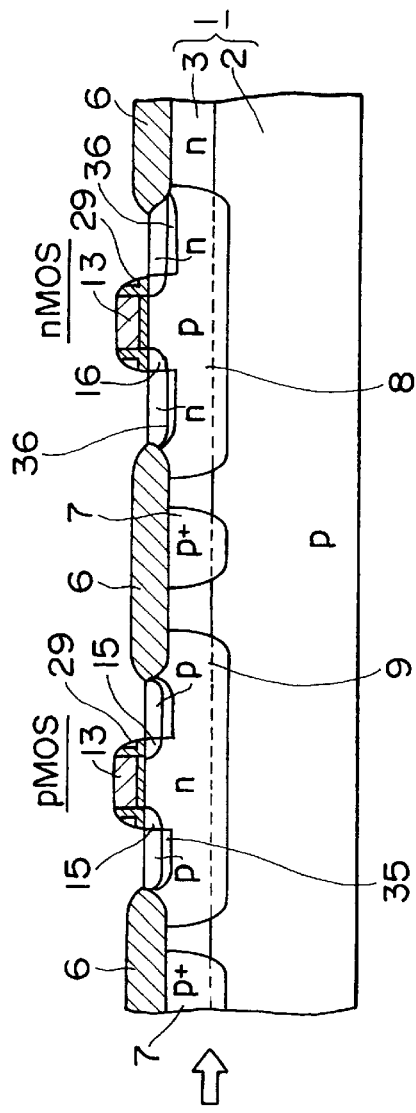
FIG. 17A
FIG. 17B

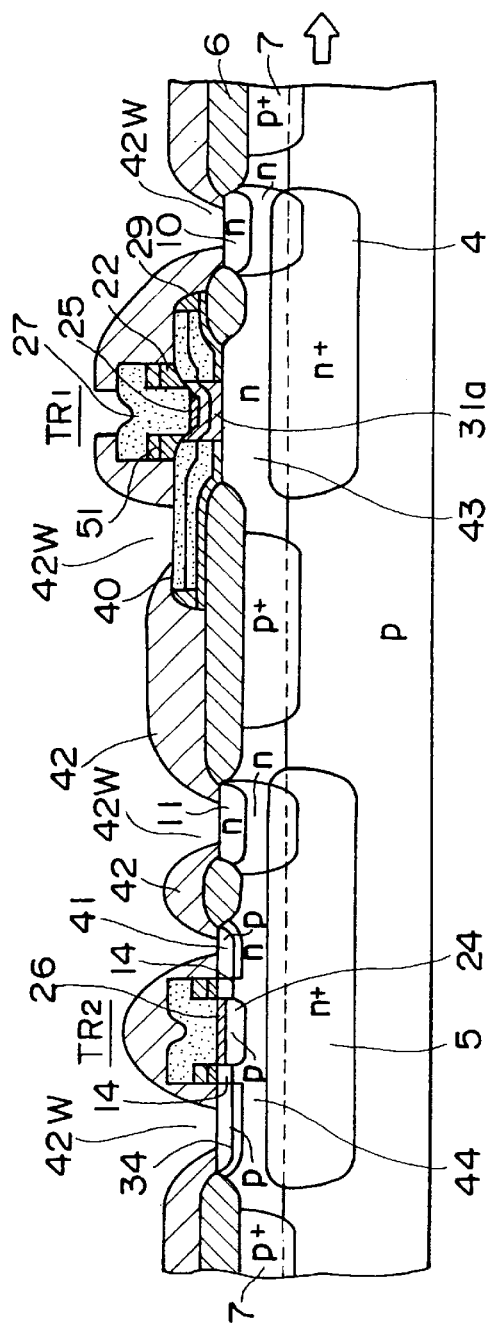
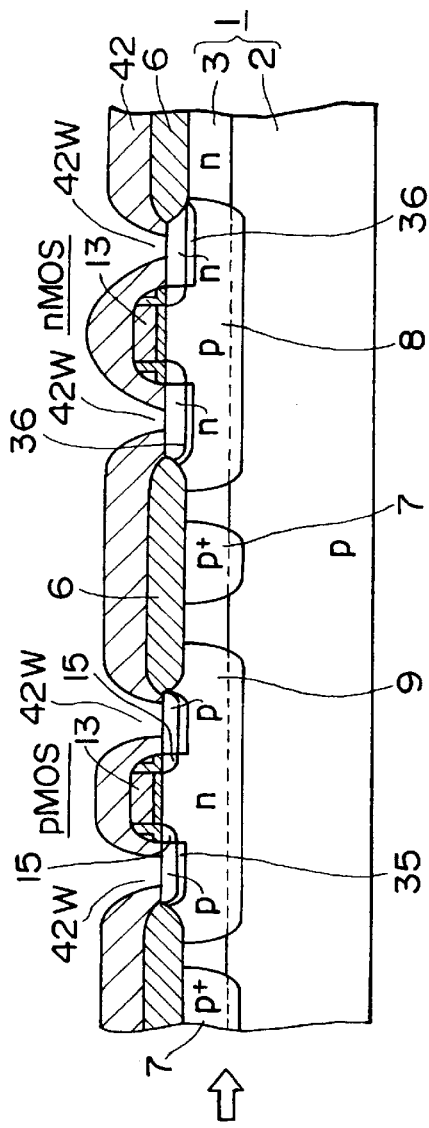
FIG. 18A
FIG. 18B

METHOD OF FABRICATING SEMICONDUCTOR DEVICE

BACKGROUND OF THE INVENTION

The present invention relates to a method of fabricating a semiconductor device in which at least a lightly doped type (hereinafter, referred to as "LDD type") insulated-gate field-effect transistor and a bipolar transistor are formed on a common base substrate.

For example, a semiconductor device, in which LDD type insulated-gate field-effect transistors and bipolar transistors are formed on a common semiconductor base substrate, is used typically for a frequency converter of a communication system. In this case, if the bipolar transistor is configured as a bipolar transistor for high-frequency application, such a bipolar transistor is required to be operated at a high-speed. To achieve high-speed operation of the bipolar transistor, it is important to shorten a base transit-time due to shallow junction of a base of the bipolar transistor and reduce the resistance of the base.

In the case of forming a base of a bipolar transistor in accordance with a known ion implantation process, however, it is difficult to realize shallow junction of the base because of a problem of a channeling tail of an impurity concentration profile, and further, if ions of an impurity are heavily implanted to reduce the resistance of the base, there arises another problem of crystal defects caused by damages occurring upon ion implantation.

To solve the above problems, it has been known to form a base layer of a bipolar transistor in accordance with an epitaxial base technology. The epitaxial base technology, in which a high-concentration base layer having a thickness of about 50 nm can be accurately formed by epitaxial growth, becomes a focus of attention as a key technology for realizing a high-speed bipolar transistor.

In actual, a high-speed bipolar transistor exhibiting the maximum cutoff frequency being more than 50 GHz has been realized in accordance with the epitaxial base technology.

Further, a heterojunction bipolar transistor (hereinafter, referred to as "HBT") suitable for higher-speed operation can be realized by forming an epitaxial base layer made from SiGe being narrower in band gap than Si.

The performances required for a bipolar transistor, however, include not only the above high-speed operation characteristic but also a high-power amplification factor and a high-withstand voltage. The latter performances are typically required for a bipolar transistor used for a power circuit and a bipolar transistor used for a drive circuit of a cathode-ray tube (CRT).

From this viewpoint, the formation of the above-described high-concentration base layer, which is important to realize a high-speed bipolar transistor, has the following disadvantages:

(1) A current amplification factor β is reduced because of a reduction in emitter injection efficiency and thereby an emitter storage time $\tau_e$ is increased.

(2) A field strength is increased because of an increase in junction concentration between the emitter and the base and thereby a withstand voltage $BV_{ebo}$ between the emitter and the base is reduced.

Accordingly, if a bipolar transistor is used for an application requiring a high current amplification factor (high β) and a high withstand voltage (high $BV_{ebo}$), it is rather undesirable to make the concentration of a base layer of the bipolar transistor high. In other words, it is desirable to form a low-concentration base layer of the bipolar transistor used for such application not by the epitaxial base technology but by the usual ion implantation process.

Conventionally, since a method capable of carrying out the process of forming a bipolar transistor by the epitaxial base technology simultaneously with the process of forming a bipolar transistor by the usual ion implantation in such a manner that both the processes are matched to each other has not been established, it has been difficult to form both the bipolar transistors on a common semiconductor base substrate.

As a result, conventionally, a circuit including a bipolar transistor requiring high-speed operation and a circuit including a bipolar transistor requiring a high-current amplification factor and a high-withstand voltage have been formed as separate chips.

To be more specific, in the case of manufacturing a communication system including a frequency converter circuit requiring high speed operation, and a drive circuit for a CRT and an input/output circuit to an external memory requiring a high-current amplification factor and a high-withstand voltage, it has been required to provide the step for individually assembling chips including these circuits in the system and the step for connecting the chips to each other by way of wiring. This causes a problem in complicating the assembling steps of the system, thereby raising the manufacturing cost of the system.

A technology for solving the above problem has been disclosed, for example, in Japanese Patent Application No. Hei 9-133482 (Japanese Patent Laid-open No. Hei 10-321730) In accordance with this technology, a relatively low concentration base layer for a bipolar transistor requiring a high current amplification factor and a high withstand voltage is formed in an opening of a silicon nitride film formed on the surface of an n-type epitaxial layer, and a relatively high concentration and shallow junction base layer for a high-speed bipolar transistor is formed in another opening of the silicon nitride film by selective epitaxial growth.

In accordance with the related art method for fabricating a bipolar transistor, however, it has been difficult to realize a system-on-chip as a so-called BiCMOS transistor circuit in which a complementary type insulated-gate transistor, that is, so-called CMOS being high in packaging density and low in power consumption is combined with a bipolar transistor circuit.

This is because, for popularization of the BiCMOS transistor circuit, it becomes important not only to increase the performance of the BiCMOS transistor circuit but also to reduce the number of fabrication steps of the circuit for lowering the fabrication cost thereof.

From this viewpoint, the combination of a CMOS transistor circuit, in which the aspect ratio (stepped height of vertical structure/lateral dimension) becomes larger along with the trend toward finer-geometries, with a bipolar transistor of a double-polysilicon structure having a large stepped portion in the vertical direction because a base layer and an emitter layer are stacked in the vertical direction, causes a problem in complicating the wiring step thereby raising the fabrication cost.

The related art method of fabricating a bipolar transistor, in which a base layer of a high-speed bipolar transistor is formed by using a selective epitaxial technology, has another problem that since the selective epitaxial technology has a complicated reaction mechanism, it is difficult to perfectly suppress the formation of nuclei on an insulating film and form an epitaxial layer with a good crystallinity on a silicon substrate with a high controllability and a high production yield.

SUMMARY OF THE INVENTION

A first object of the present invention is to provide a method of fabricating a semiconductor device having at least an insulated-gate field effect transistor (hereinafter, referred to as "an MOS transistor", which is not limited only to the MOS transistor having a gate insulating layer configured as an oxide film) and a bipolar transistor, particularly, a heterojunction type bipolar transistor (hereinafter, referred to as "an HBT), which method is intended to reduce the number of fabrication steps and improve the reliability of the semiconductor device.

A second object of the present invention is to provide a method of fabricating a semiconductor device having at least an MOS transistor and a BiCMOS transistor having an HBT, which method is intended to reduce the number of fabrication steps and improve the reliability of the semiconductor device.

A third object of the present invention is to provide a method of simply fabricating a bipolar transistor having a high current amplification factor and a high withstand voltage formed by an ion implantation process, a bipolar transistor allowing high-speed operation formed by an epitaxial base technology, and a CMOS suitable for packaging with these bipolar transistors, on the same semiconductor base substrate at a low cost.

A fourth object of the present invention is to form a base layer for a high-speed bipolar transistor not by using a difficult selective epitaxial technology but by using an easy overall epitaxial technology.

To achieve the above objects, according to a first aspect of the present invention, there is provided a method of fabricating a semiconductor device in which a bipolar transistor and a field effect transistor are formed on a common base substrate, including the steps of: forming first source and drain regions and a gate electrode of the field effect transistor; forming a first insulating film on the base substrate; forming an opening in the first insulating film at a position over an operational region of the bipolar transistor; forming a semiconductor layer as a single crystal semiconductor layer on the surface of the base substrate exposed from the opening and as a polycrystalline semiconductor layer on the first insulating film; processing the semiconductor layer; forming a second insulating film on the semiconductor layer and on a region of the field effect transistor; forming side walls on the side walls of the gate electrode by etching the first and second insulating films; and forming second source and drain regions by doping an impurity with the gate electrode and the side walls as a mask.

The single crystal semiconductor layer may form a base region of the bipolar transistor and the polycrystalline semiconductor layer may form a base extraction region of the bipolar transistor.

At the step of forming second source and drain regions by doping an impurity, the impurity may be simultaneously doped in the polycrystalline semiconductor layer to form a base extraction electrode.

The above fabrication method may further include the step of forming a third insulating film having a thickness nearly equal to that of the first insulating film between the semiconductor layer and the second insulating film.

The above fabrication method may further include the step of forming an element isolation layer for isolating the bipolar transistor from the field effect transistor, and a well region including the first and second source and drain regions of the field effect transistor by the same impurity doping step.

The impurity concentration of the second source and drain regions may be higher than that of the first source and drain regions.

According to a second aspect of the present invention, there is provided a method of fabricating a semiconductor device in which first and second bipolar transistors different in characteristic from each other and a field effect transistor are formed on a common base substrate, including the steps of: forming first source and drain regions and a gate electrode of the field effect transistor; forming a first insulating film on the base substrate; forming an opening in the first insulating film at a position over an operational region of the first bipolar transistor; forming a semiconductor layer as a single crystal semiconductor layer on the surface of the base substrate exposed from the opening and as a polycrystalline semiconductor layer on the first insulating film; processing the semiconductor layer; forming a second insulating film on the semiconductor layer, on a region of the second bipolar transistor, and on a region of the field effect transistor; forming side walls on the side walls of the gate electrode by etching the first and second insulating films; and forming second source and drain regions by doping an impurity with the gate electrode and the side walls as a mask.

The single crystal semiconductor layer may form a base region of the first bipolar transistor and the polycrystalline semiconductor layer may form a base extraction region of the first bipolar transistor.

At the step of forming second source and drain regions by doping an impurity, the impurity may be simultaneously doped in the polycrystalline semiconductor layer to form a base extraction electrode.

The above fabrication may further include the step of forming a third insulating film having a thickness nearly equal to that of the first insulating film between the semiconductor layer and the second insulating film.

The above fabrication method may further include the step of forming element isolation layers for isolating the first and second bipolar transistor and the field effect transistor from each other, and a well region including the first and second source and drain regions of the field effect transistor by the same impurity doping step.

The impurity concentration of the second source and drain regions may be higher than that of the first source and drain regions.

The above fabrication method further include the step of forming collector extraction regions of the first and second bipolar transistors, and a well region including the first and second source and drain regions of the field effect transistor by the same impurity doping step.

The above fabrication method may further include the step of forming emitter electrodes of the first and second bipolar transistors by the same step.

At the step of forming second source and drain regions by doping an impurity, the impurity may be simultaneously doped in the second bipolar transistor portion and the polycrystalline semiconductor layer of the first bipolar transistor to form a graft base region for extracting an intrinsic base region of the second bipolar transistor and a base extraction electrode of the first bipolar transistor, respectively.

The first source and drain regions and a link base region for connecting the intrinsic base region of the second bipolar transistor to the graft base region may be formed by the same impurity doping step.

According to a third aspect of the present invention, there is provided a method of fabricating a semiconductor device in which a first bipolar transistor including a base region formed by epitaxial growth, a second bipolar transistor including a base region formed by ion implantation, a first field effect transistor having a first conductive type channel, and a second field effect transistor having a second conductive type channel, including the steps of: forming gate insulating films and gate electrodes of the first and second field effect transistors by the same step; forming first source and second regions of the first and second field effect transistors using the gate electrode as a mask; forming a first insulating film on the base substrate; forming an opening in the first insulating film at a position over an operational region of the first bipolar transistor; forming a semiconductor layer as a single crystal semiconductor layer on the surface of the base substrate exposed from the opening and as a polycrystalline semiconductor layer on the first insulating film; processing the semiconductor layer; forming a second insulating film on the semiconductor layer, on a region of the second bipolar transistor, and on regions of the first and second field effect transistors; forming side walls on the side walls of the gate electrode of each of the first and second field effect transistors by etching the first and second insulating films; and forming second source and drain regions of each of the first and second field effect transistors by doping an impurity using the gate electrode and the side walls as a mask.

The impurity concentration of the second source and drain regions of each of the first and second field effect transistors may be higher than that of the first source and drain regions of each of the first and second field effect transistors.

The above fabrication method may further include the step of forming collector extraction regions of the first and second bipolar transistors, and a well region including the first and second source and drain regions of the first field effect transistor by the same impurity doping step.

At the step of forming second source and drain regions of the first field effect transistor by doping an impurity, the impurity may be simultaneously doped in the second bipolar transistor portion and the polycrystalline semiconductor layer of the first bipolar transistor to form a graft base region for extracting an intrinsic base region of the second bipolar transistor and a base extraction electrode of the first bipolar transistor, respectively; and the first source and drain regions of the first field effect transistor and a link base region for connecting the intrinsic base region of the second bipolar transistor to the graft base region may be formed by the same impurity doping step.

As described above, according to the fabrication method of the present invention, since the insulating layer for forming side walls of the field effect transistor is formed by a stack of the first and second insulating films and the objective bipolar transistor having the HBT configuration is formed not by the conventional selective epitaxial growth technology but by the overall epitaxial growth technology using the lower first insulating film as a mask, it is possible to simplify the fabrication steps and enhance the reliability of the semiconductor device.

BRIEF DESCRIPTION OF THE DRAWINGS

FIGS. 1A and 1B to FIGS. 10A and 10B are schematic sectional views showing fragmental structures of a semiconductor device at respective steps of fabricating of the semiconductor device according to one embodiment of the present invention, wherein each of FIGS. 1A, 2A, . . . , 10A is a half structure and each of FIGS. 1B, 2B, . . . , 10B is the remaining half structure; and FIGS. 11A and 11B to FIGS. 18A and 18B are schematic sectional views showing fragmental structures of a semiconductor device at respective steps of fabricating the semiconductor device according to another embodiment of the present invention, wherein each of FIGS. 11A, 12A, . . . , 18A is a half structure and each of FIGS. 11B, 12B, . . . , 18B is the remaining half structure.

DETAILED DESCRIPTION OF THE PREFERRED EMBODIMENTS

Hereinafter, one embodiment of the present invention will be described with reference to FIGS. 1A and 1B to FIGS. 10A and 10B.

In this embodiment, the present invention is applied to a method of fabricating a semiconductor device having a BiCMOS structure in which a first bipolar transistor for high speed operation configured as an npn type heterojunction bipolar transistor (HBT) including an epitaxial base layer made from SiGe, a second bipolar transistor for high withstand voltage configured as a usual type bipolar transistor, and a CMOS having an n-channel type insulated-gate field effect transistor (MOSFET) and a p-channel type MOSFET, are formed as semiconductor elements on a common semiconductor base substrate.

Figures 2A, 2B:
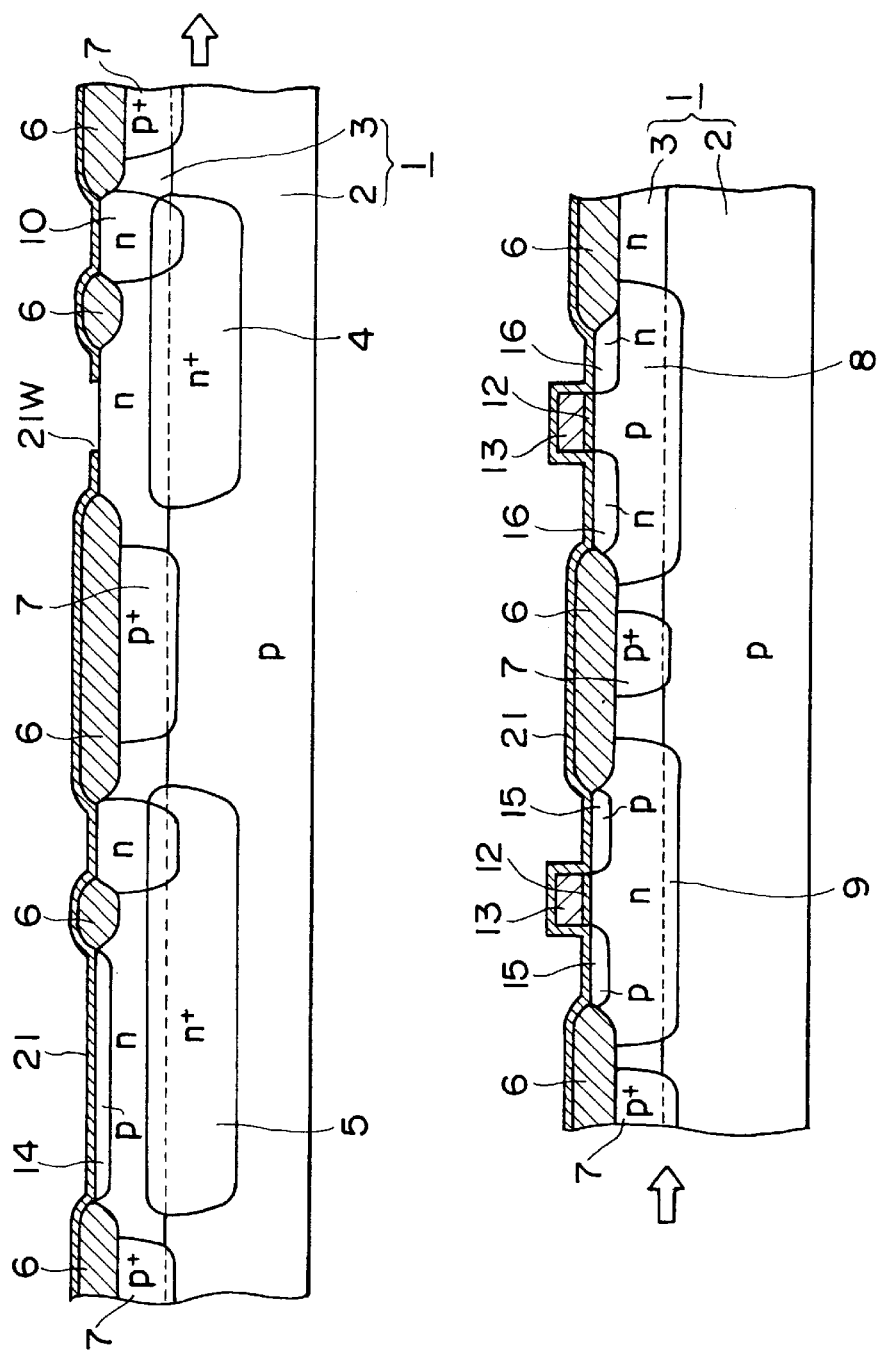

FIGS. 1A and 1B to FIGS. 10A and 10B are schematic sectional views each showing a fragmental structure of a semiconductor device of the present invention at one fabrication step, wherein the right end of a half-structure shown in FIG. 1A, 2A, . . . or 10A is continuous to the left end of a half-structure shown in FIGS. 1B, 2B, . . . or 10B to constitute one fragmental structure of the semiconductor device.

Referring first to FIGS. 1A and 1B, an Si semiconductor layer 3 of a second conductive type (n-type in this embodiment) having a resistivity of 1 to 5 $\Omega$cm is formed by epitaxial growth to a thickness of 0.7 to 2.0 $\mu$m on an Si semiconductor substrate 2 of a first conductive type (p-type in this embodiment) having the (100) crystal face as the substrate plane, to form a semiconductor base substrate 1.

A first n-type collector buried resin 4 and a second n-type collector buried region 5, each having a high impurity concentration, are formed in the semiconductor base substrate 1 at a portion where a first bipolar transistor configured as an HBT for high speed operation is to be formed and at a portion where a second bipolar transistor configured as a usual bipolar transistor for high withstand voltage, respectively.

Each of the first and second collector buried regions 4 and 5 is formed by diffusing, before formation of the semiconductor layer 3 on the semiconductor substrate 2 by epitaxial growth, Sb in a vapor-phase in the principal plane of the semiconductor substrate 2 at 1200° C. by using $Sb_2O_3$.

An isolation insulating layer 6 is formed on the surface of the semiconductor base substrate 1, that is, on the surface of the semiconductor layer 3 at portions required to be electrically isolated from each other by a so-called LOCOS (Local Oxidation of Silicon) process.

While not shown, the LOCOS process is performed by forming an $SiO_2$ pad layer having a thickness of 50 nm by thermal oxidation of the surface of the semiconductor layer 3 and forming an $Si_3N_4$ layer having a thickness of 100 nm by a CVD (Chemical Vapor Deposition) process, to form an anti-oxidation mask layer; and forming openings in the anti-oxidation mask layer at the portions, where the isolation insulating layer is to be formed, by pattern-etching using a pattern formed by photolithography as a mask.

The surface of the semiconductor base substrate 1 covered with the anti-oxidation mask layer having the above openings is subjected to steam-oxidation at a temperature of 1000 to 1050° C., to form the isolation insulating layer 6 having a thickness of 300 to 800 nm at the portions required to be isolated from each other.

After removal of the anti-oxidation mask layer, p-type element isolation regions 7 are formed at portions to be electrically isolated from each other and at the same time a p-type first well region 8 is formed in an n-channel MOSFET forming portion by repeating implantation of ions of boron (B) at a voltage of 100 to 720 keV in a dose of $1 \times 10^{12}$ to $5 \times 10^{13}/cm^2$ by several times.

Subsequently, an n-type second well region 9 is formed in a p-channel MOSFET (pMOS) forming portion and at the same time collector electrode extraction regions 10 and 11 on the first and second collector buried regions 4 and 5 of the first and second bipolar transistors, respectively by repeating implantation of ions of phosphorus (P) at a voltage of 150 to 720 keV in a dose of $1 \times 10^{12}$ to $5 \times 10^{13}/cm^2$ by several times.

A gate insulating film 12 and a gate electrode 13 are formed in each of the n-channel MOSFET (nMOS) forming portion and the p-channel MOSFET (pMOS) formation area.

To be more specific, the gate insulating film 12 and the gate electrode 13 are formed in accordance with the following procedure: namely, the surface of the semiconductor base substrate 1, that is, the surface of the semiconductor layer 3 is subjected to thermal oxidation at a temperature of 800 to 900° C., to form an oxide film having a thickness of 7 to 10 nm at portions, where the thick isolation insulating layer 6 is not formed, of the surface of the semiconductor base substrate 1; a polycrystalline Si layer heavily doped with an n-type impurity and a silicide layer of a refractory metal such as tungsten W, that is, a silicide WSi layer are sequentially stacked on the overall surface of the oxide film; and the oxide film and the doublelayer film of the polycrystalline Si layer and silicide WSi layer are patterned by dry-etching using a specific resist pattern as a mask, to form the gate insulating film 12 and the gate electrode 13 in each of the MOSFETs (nMOS and pMOS) forming portions.

A photoresist layer (not shown) used as part of an ion implantation mask is then formed to cover the first bipolar transistor forming portion, the n-channel MOSFET (nMOS) forming portion, and the second collector electrode extraction region 11 of the second bipolar transistor. With the photoresist layer and the gate electrode 13 of the p-channel MOSFET (pMOS) forming portion taken as the ion implantation mask, a p-type link base region 14 is formed in the second bipolar transistor forming portion, and at the same time a p-type low concentration source or drain region and a p-type low concentration drain or source region 15 (hereinafter, referred to as "source/drain regions") 15 are formed in the p-channel MOSFET (pMOS) forming portion in such a manner as to be located on both sides of the gate electrode 13.

To be more specific, the link base region 14 and the source/drain regions 15 are formed by implanting ions of $BF_2$ in a dose of $1 \times 10^{12}$ to $5 \times 10^{13}/cm^2$.

The photoresist layer used for the ion implantation mask is removed, and a photoresist layer (not shown) taken as part of an ion implantation mask is again formed. With the photoresist layer and the gate electrode 13 of the n-channel MOSFET (nMOS) taken as the ion implantation mask, n-type low concentration source/drain regions 16 are formed on both sides of the gate electrode 13.

It should be noted that the formation order of the source/drain regions 15 and 16 may be reversed, and more concretely, the source/drain region 16 may be formed before the source/drain region 15 are formed.

The photoresist layer used for the ion implantation mask is removed, and as shown in FIGS. 2A and 2B, a first insulating film 21 made from $SiO_2$ is formed to a thickness of 50 to 100 nm on the overall surface by a CVD process and an opening 21W is formed at a specific portion, other than the collector electrode extraction region 10, of the first bipolar transistor forming portion.

To be more specific, the opening 21W is formed by forming, by photolithography, a photoresist pattern having an opening at a portion where the opening 21W is to be formed, and forming the opening 21W in the first insulating film 21 by low damage etching, typically, dry-etching and wet-etching using the photoresist pattern as an etching mask.

Figure 3A:
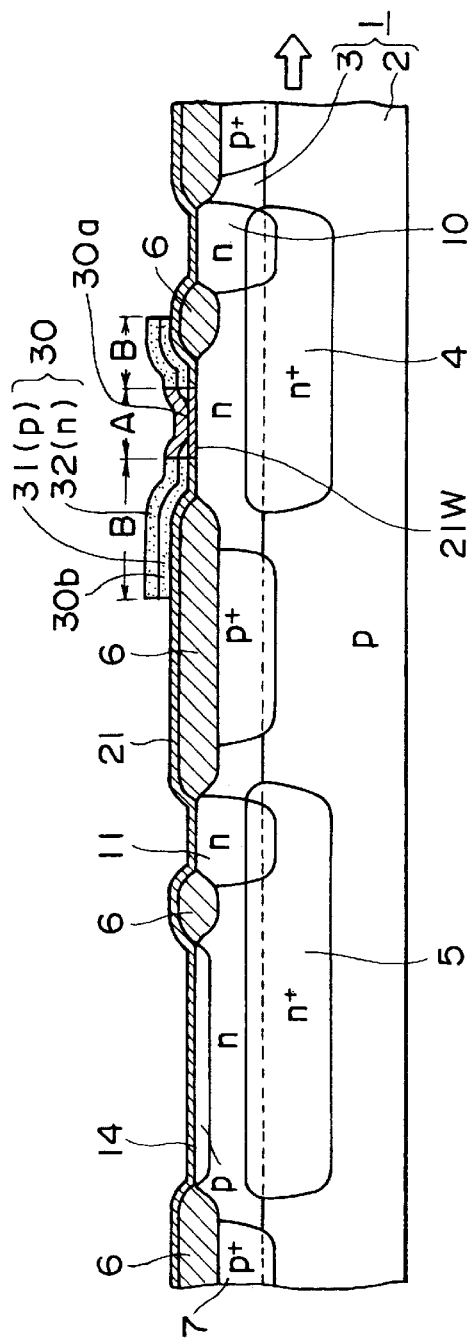
Figure 3B:
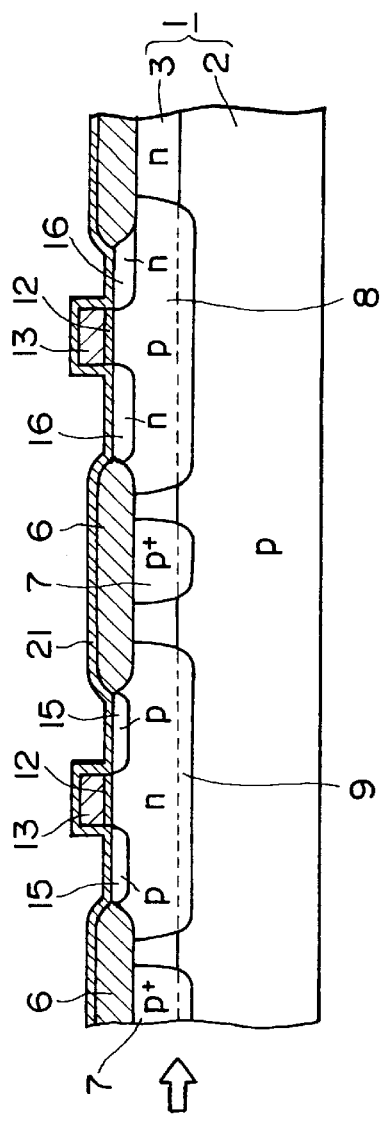

As shown in FIGS. 3A and 3B, a semiconductor layer 30 having a specific pattern is formed in the first bipolar transistor forming portion in such a manner as to be buried in the opening 21W and to extend onto the portion, around the opening 21W, of the isolation insulating layer 6.

To be more specific, a surface portion, exposed from the opening 21W, of the semiconductor base substrate 1 is subjected to hydrogen passivation by cleaning it with hydrofluoric acid, and then the semiconductor layer 30 is formed on the overall surface by either of an ultra-high vacuum CVD process, a molecular beam epitaxy, and a low pressure CVD process.

The semiconductor layer 30 has a stacked structure of first and second semiconductor layers 31 and 32. The first semiconductor layer 31 configured as a p-type high impurity concentration SiGe film, which forms an HBT base layer, is first formed by epitaxial growth, and then the second semiconductor layer 32 configured as an n-type low impurity concentration Si layer, which forms an emitter layer, is formed by epitaxial growth.

In this case, the film formation condition of the semiconductor layer 30 is selected such that the semiconductor layer 30 is formed as a single crystal layer at a portion A on the semiconductor layer 3 through the opening 21W, and is formed as a polycrystalline layer at a portion B on the first insulating film 21.

In addition, as compared with the selective epitaxy described above, the epitaxial process used for forming the semiconductor layer 30 is simple in reaction system, being good in controllability, and excellent in productivity.

The formation of the semiconductor layer 30, for example, by the low pressure CVD process is performed as follows: First, after hydrogen pre-baking at 900° C. for 5 min as needed, the first semiconductor layer 3 is formed to a thickness of 20 to 80 nm at a pressure of 8 kPa and at a film formation temperature of 700° C. by using $SiH_4$, $GeH_4$ and $B_2H_6$ as reaction gases. In this case, the flow rates of these gases are set such that the concentration of boron (B) becomes a value in a range of $5 \times 10^{18}$ to $5 \times 10^{19}/cm^3$ and the concentration of Ge becomes a value in a range of 5 to 20 atomic %.

The n-type semiconductor layer 32 is formed on the first semiconductor 31 to a thickness of 50 to 100 nm at a pressure of 8 kPa and at a film formation temperature of 750° C. by using $SiH_4$ and $PH_3$ as reaction gases. In this case, the flow rates of the gases are set such that the concentration of phosphorus becomes a value in a range of $1 \times 10^{17}$ to $5 \times 10^{18}/cm^3$.

Each of the first and second semiconductor layers 31 and 32 is formed as a single crystal silicon layer at the portion A on the semiconductor layer 3 made from single crystal silicon through the opening 21W and is formed as a polycrystalline silicon layer at the portion B on the insulating film 21.

The semiconductor layer 30 is patterned by etching using a specific pattern formed by photolithography as a mask.

To be more specific, the semiconductor layer 30 in the first bipolar transistor forming portion is subjected to pattern-etching by RIE (Reactive Ion Etching), and more concretely, the operational region 30a at the single crystal portion A in the opening 21W and the base extraction region 30b for finally constituting a base extraction electrode 40 at the polycrystalline portion B extending on the isolation insulating layer 6 remain and the other portion of the semiconductor layer 30 is removed.

Figures 4A, 4B:
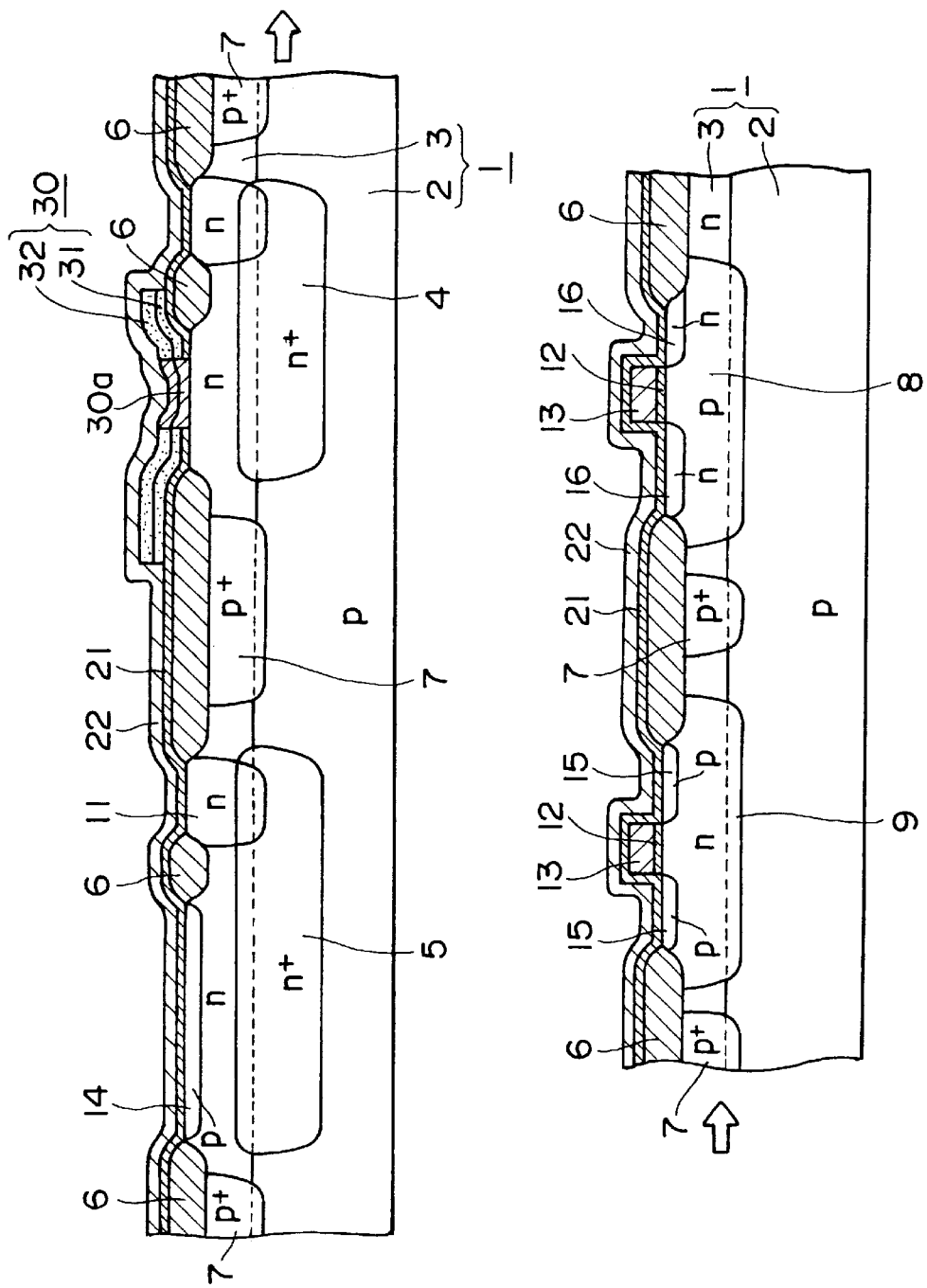

Referring to FIGS. 4A and 4B, a second insulating film 22 made from $SiO_2$ is formed to a thickness of 150 to 250 nm on the overall surface by the CVD process.

Referring to FIGS. 5A and 5B, the portion at which only the second insulating film 22 is formed, and the portion at which the first and second insulating films 21 and 22 are formed are subjected to pattern-etching by RIE using a pattern formed by photolithography as a mask, to form an opening $22W_1$ on the second semiconductor layer 32 at an emitter forming portion of the operational region 30a of the first bipolar transistor and form an opening $22W_2$ on part of the link base region 14 of the second bipolar transistor.

Referring to FIGS. 6A and 6B, the opening $22W_1$ is covered with an ion implantation mask layer 23 formed of a photoresist layer, and then ions of $BF_2$ are implanted in the link base region 14 exposed from the opening $22W_2$ at a voltage of 20 to 50 keV in a does of $5 \times 10^{13}$ to $1 \times 10^{14}/cm^3$, to form an intrinsic base region 24 of the second bipolar transistor.

Figures 7A, 7B:
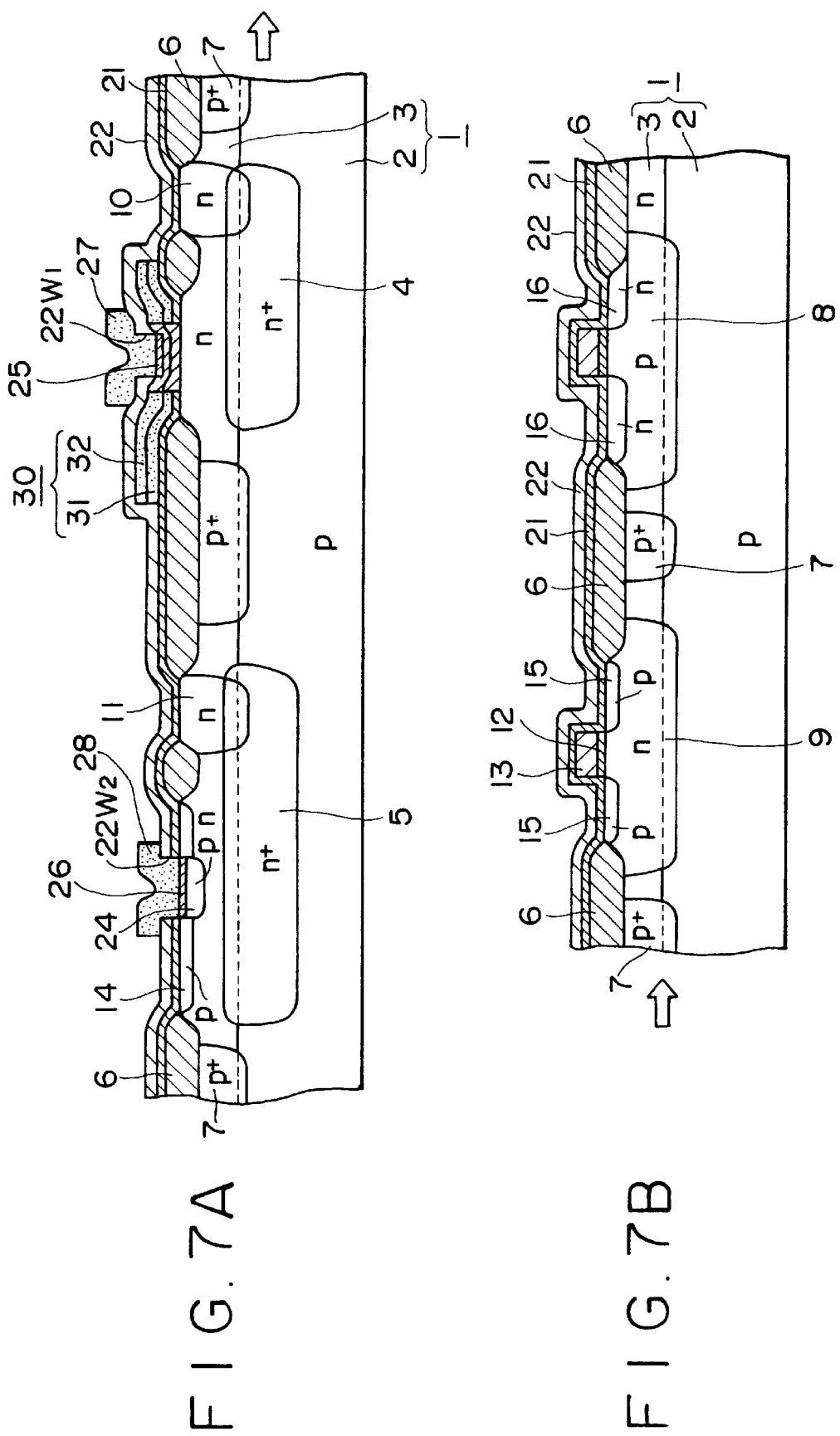

Referring to FIGS. 7A and 7B, emitter regions 25 and 26 and emitter extraction electrodes 27 and 28 are formed in the first and second bipolar transistor forming portions, respectively.

To be more specific, after removal of the mask layer 23 shown in FIGS. 6A and 6B, a polycrystalline Si layer is formed to a thickness of 150 nm on the overall surface by the CVD process, and ions of an n-type impurity such as As are implanted at a voltage of 30 to 70 keV in a does of $1 \times 10^{15}$ to $1 \times 10^{16}/cm^2$, followed by annealing at a temperature of 1000 to 1100° C. for 5 to 30 seconds, to form the emitter regions 25 and 26 by diffusing As contained in polycrystalline Si into the second semiconductor layer 32 and the intrinsic base region 24 through the openings $22W_1$ and $22W_2$, respectively.

The polycrystalline Si layer is then subjected to pattern-etching by RIE using a pattern formed by photolithography as a mask to form the emitter extraction electrodes 27 and 28, which have specific patterns being in contact with the emitter regions 25 and 26, on the emitter regions 25 and 26, respectively.

Referring to FIGS. 8A and 8B, the second insulating film 22 and the first insulating film 21 are subjected to anisotropic-etching by RIE from the surface of the second insulating film 22 using the emitter extraction electrodes 27 and 28 as a mask, to leave substantially thick portions on side surfaces of each gate electrode 13, thereby forming side walls 29 on the side surfaces of each gate electrode 13.

Figure 9A:
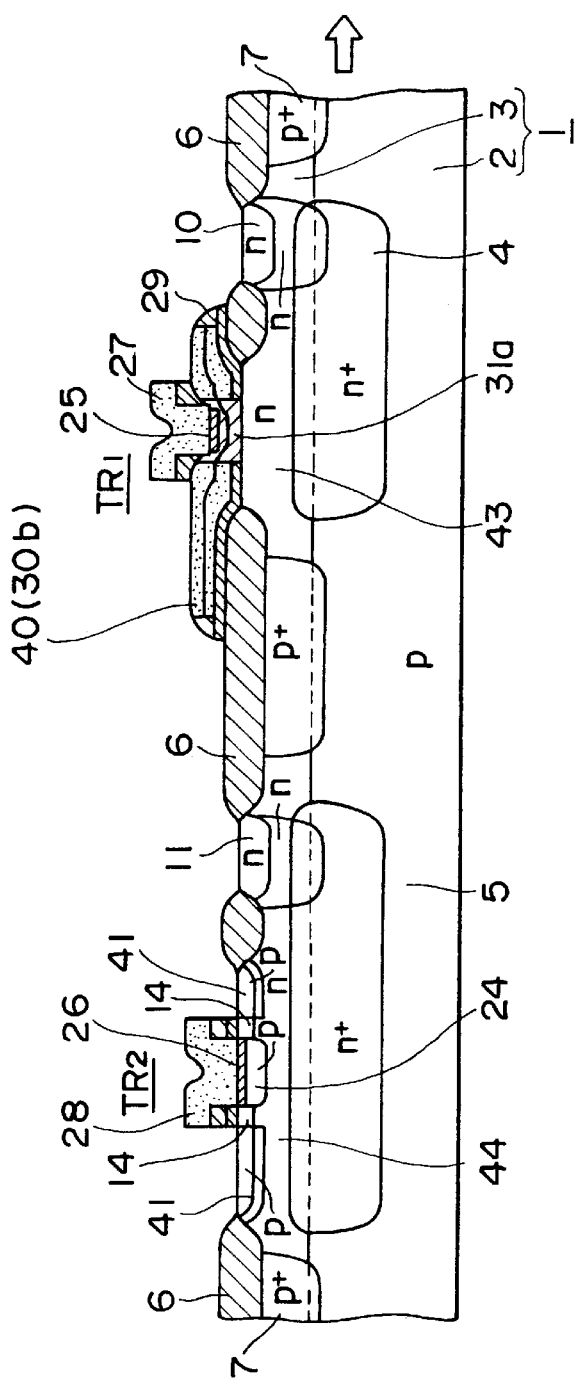
Figure 9B:
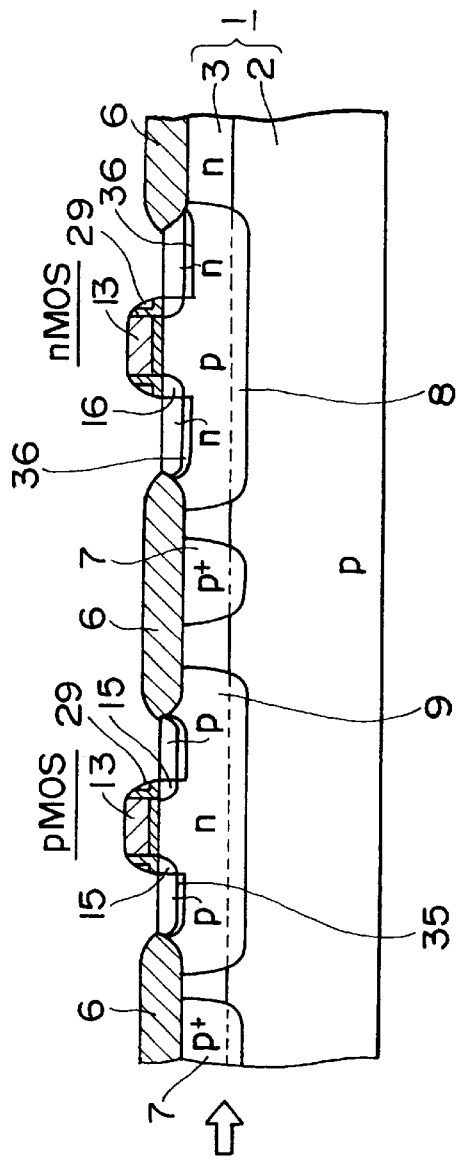

Referring to FIGS. 9A and 9B, high concentration source/drain regions 35 and 36, a base extraction electrode 40, a graft base region 41, and the like are formed.

To be more specific, the overall surface other than the n-channel MOSFET (nMOS) forming portion and the collector electrode extraction regions 10 and 11 of the first and second bipolar transistors is covered with an ion implantation mask formed of a photoresist layer (not shown), and ions of As are implanted at a voltage of 25 to 40 keV in a dose of $2 \times 10^{15}$ to $7 \times ^{15}/cm^2$, to form n-type high concentration source/drain regions 36 with the gate electrode 13 and the side walls 29 taken as a mask in the n-channel MOSFET forming portion, and at the same time ions of the same n-type impurity are further implanted in the collector electrode extraction regions 10 and 11 of the first and second bipolar transistors.

After or before the formation of the source/drain regions 36 by ion implantation, the overall surface other than the n-channel MOSFET forming portion and the collector electrode extraction regions 10 and 11 of the first and second bipolar transistors is covered with an ion implantation mask formed of a photoresist layer (not shown), ions of $BF_2$ are implanted at a voltage of 25 to 40 keV in a dose of $1 \times 10^{15}$ to $5 \times 10^{15}/cm^2$, to form p-type high concentration source/drain regions 35 with the gate electrode 13 and the side walls 29 taken as a mask in the p-channel MOSFET forming portion, and at the same time a base extraction electrode 40 is formed in the base extraction region 30b formed of the polycrystalline portion of the semiconductor layer 30 in the first bipolar transistor forming portion with the emitter extraction electrode 27 taken as a mask. At the same time, a graft base region 41 is formed in the second bipolar transistor forming portion with the emitter extraction electrode 28 taken as a mask.

In this way, an HBT type first bipolar transistor $TR_1$ is formed, which includes a collector region 43 made from Si of the semiconductor layer 3 on the collector buried region 4, and which includes in the operational region 30a on the collector region 43, the base region 31a made from SiGe, the emitter region 25 made from Si formed on the base region 31a, the base extraction electrode 40 extracted from the base region 31a, the emitter extraction electrode 27 extracted from the emitter region 25, and the collector electrode extraction region 10 extracted from the collector region 43.

A second bipolar transistor $TR_2$ having a usual vertical structure is formed, which includes the collector region 44 made from Si of the semiconductor layer 3 on the collector buried region 5, the intrinsic region 24 on the collector region 44, the emitter region 26 formed on the intrinsic base region 24, the graft base region 41 connected to the intrinsic base region 24 via the link base region 14, the emitter extraction electrode 28 extracted from the emitter region 26, and the collector electrode extraction region 11 extracted from the collector region 44.

An LDD type p-channel MOSFET (pMOS) is formed, which includes a gate portion composed of the gate electrode 13 formed on the gate insulating film 12, and the high concentration source/drain regions 35 formed on both the sides of the gate portion via the low concentration source/drains regions 15. Meanwhile, an LDD type n-channel MOSFET (nMOS) is formed, which includes a gate portion composed of the gate electrode 13 formed on the gate insulating film 12, and the high concentration source/drain regions 36 formed on both the sides of the gate portion via the low concentration source/drain regions 16.

Figure 10A:
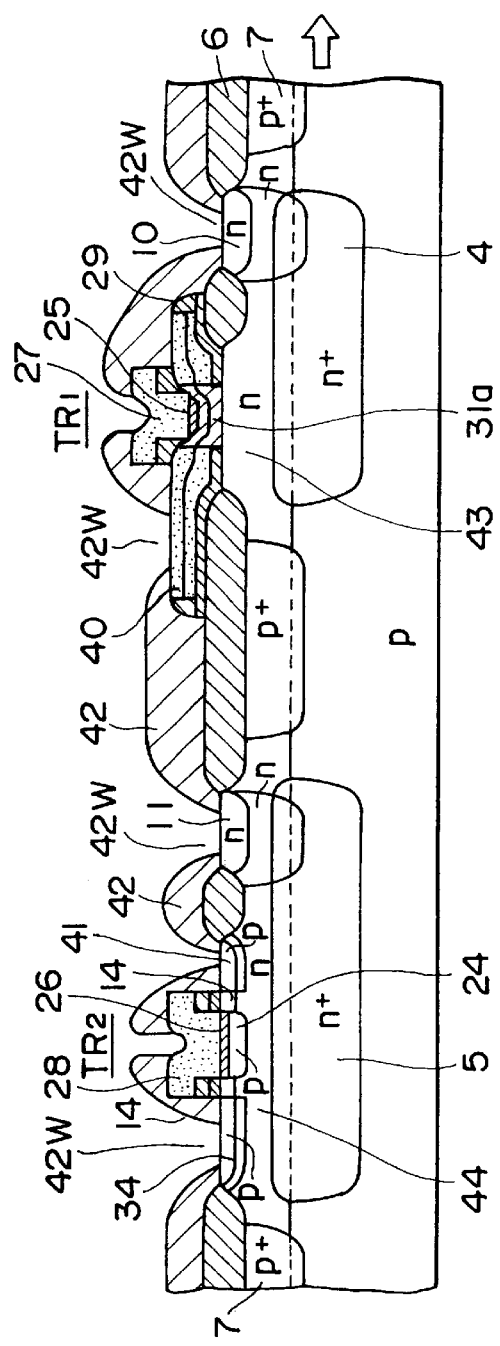
Figure 10B:
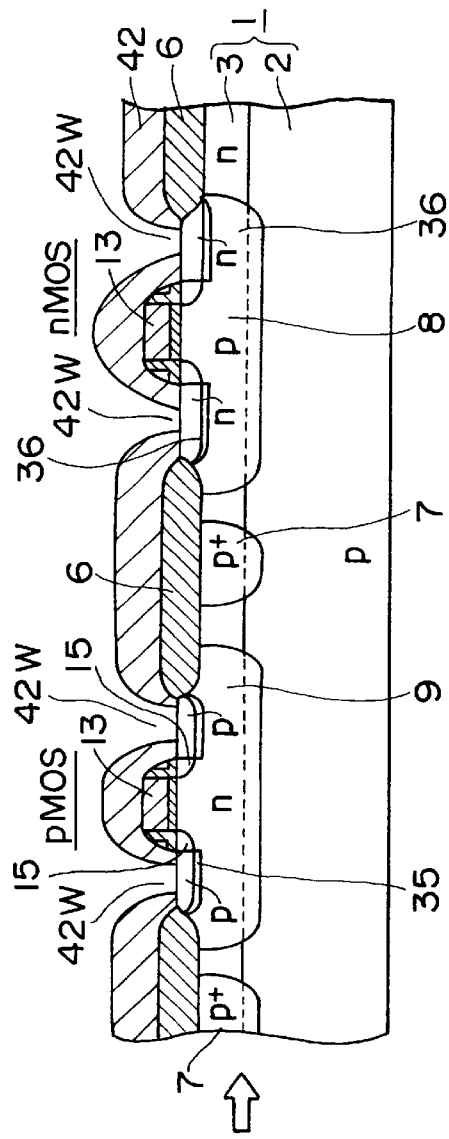

Referring to FIGS. 10A and 10B, a reflow film 42 made from BPSG (Borophosphosilicate Glass) is formed on the overall surface by the CVD process, and contact windows 42W for allowing the contact of metal electrodes such as Al electrodes therethrough are formed in the first bipolar transistor $TR_1$ at positions over the emitter extraction electrode 27, the base extraction electrode 40 and the collector electrode extraction region 10, in the second bipolar transistor $TR_2$ at positions over the emitter extraction electrode 28, the graft base region 41 and the collector electrode extraction region 11, and in the p-channel MOSFET (pMOS) and the n-channel MOSFET (nMOS) at positions over the gate electrodes 13 and the high concentration source/drain regions 35 and 36. The reflow film 42 is then allowed to reflow by heat-treatment at a temperature of 850 to 900° C. for 10 to 30 minutes to smoothen portions, positioned at the edges of the contact windows 42W and the shoulders of the stepped portions, of the reflow film 42.

While not shown, in accordance with the known manner, metal electrodes are brought into contact with the associated electrodes and regions through the contact windows 42W, and then an interlayer insulating film, a multi-layer interconnection layer, a protective insulating film, and the like are formed, to form a semiconductor device.

According to the above-described method of the present invention, there can be fabricated the semiconductor device in which the first bipolar transistor $TR_1$ having the HBT configuration for high-speed operation formed by the epitaxial base technology, the second bipolar transistor $TR_2$ having a high current amplification factor and a high withstand voltage formed by the ion implantation process, and the n-channel MOSFET (nMOS) and the p-channel MOSFET (pMOS) are formed, that is, packaged on the common base substrate 1.

The semiconductor layer 30 constituting part of the first bipolar transistor $TR_1$ having the HBT configuration for high-speed operation is formed not by selective epitaxial technology but by overall epitaxial technology, and accordingly, the semiconductor layer can be simply fabricated. Since the portion, positioned in the operational portion 30a, of the semiconductor layer 30 is formed of the epitaxial layer having a good crystallinity directly formed on the semiconductor layer 3 of the semiconductor base substrate 1 in the opening 21W of the first insulating film 21, it is possible to fabricate the high-speed bipolar transistor having good characteristics with a high reliability.

Since most of the steps of fabricating the first bipolar transistor $TR_1$ having the HBT configuration, the second bipolar transistor $TR_2$ having the usual configuration, the n-channel MOS transistor, and the p-channel MOS transistor on the common base substrate are common to each other, it is possible to reduce the number of the fabrication steps. For example, the doping of the impurity in the SiGe semiconductor layer 31 for formation of the base extraction electrode 40 of the first bipolar transistor $TR_1$ having the HBT configuration and the doping of the impurity for forming the source/drain regions 35 of the pMOS are performed at the same step, and also the emitter formation step in the first bipolar transistor $TR_1$ is common to the emitter formation step in the second bipolar transistor $TR_2$, and accordingly, it is possible to simplify the fabrication steps, and hence to enhance the mass-productivity and reduce the fabrication cost.

According to the method of fabricating a semiconductor device of the present invention, the insulating film for forming the side walls in each of the n-channel and p-channel MOS transistors is divided into the first and second insulating films 21 and 22, and the semiconductor layer 30, that is, the intrinsic base region 31a constituting part of the first bipolar transistor $TR_1$ having the HBT configuration is formed between the first and second insulating films 21 and 22 and the base extraction electrode 40 is formed by ion implantation with the emitter extraction electrode 27 taken as a mask, and accordingly, it is possible to make smaller the vertical step in the transistor $TR_1$. As a result, since the bipolar transistor $TR_1$ can be performed simultaneously with the usual CMOS formation step without the need of any complicated interconnection step and the like, it is possible to avoid the increase in fabrication cost.

In the case of forming the openings $22W_1$ and $22W_2$ shown in FIGS. 5A and 5B in the above embodiment, at the opening $22W_2$ forming portion, since the first and second insulating films 21 and 22 are stacked, RIE must be performed to a depth equivalent to the total thickness of the first and second insulating films 21 and 22; while at the opening $22W_1$ forming portion positioned on the semiconductor layer 30, since only the first insulating film 21 is formed, if RIE is performed to such an extent as to certainly form the opening $22W_{21}$, over-etching occurs in the opening $22W_1$ on the semiconductor layer 30, and more concretely, in the opening $22W_1$, etching may proceed to the upper Si film, that is, the semiconductor layer 32 of the semiconductor layer 30.

Similarly, upon formation of the side walls by RIE shown in FIGS. 8A and 8B, etching may proceed to the upper semiconductor layer 32 of the semiconductor layer 30.

If the second Si semiconductor layer 32 is partially cut or thinned by over-etching, there occurs the degradation of the operational ability of the transistor, and at the worst case, there occurs the deterioration of characteristics such as contamination of Ge, that is, so-called cross-contamination due to exposure of the first SiGe semiconductor layer as the lower layer of the semiconductor layer 30, resulting in the reduced reliability of the semiconductor device.

One embodiment of a method of solving the over-etching of the semiconductor layer 30 at the RIE step will be described with reference to FIGS. 11A and 11B to FIGS. 18A and 18B.

Even in this embodiment, a semiconductor layer 30 having a specific pattern composed of a first semiconductor layer 31 and a second semiconductor layer 32 stacked on the first semiconductor layer 31 is formed in the first bipolar transistor forming portion in accordance with the same steps as those described with reference to FIGS. 1A and 1B to FIGS. 3A and 3B; however, as the feature of this embodiment, as shown in FIGS. 11A and 11B, a buffer layer 51 made from $Sio_2$ having a thickness nearly equal to that of the first insulating film 21 is deposited on the semiconductor layer 30.

To be more specific, in this embodiment, the first and second semiconductor layers 31 and 32 are formed on the semiconductor base substrate 1, to form the semiconductor layer 30, and then the buffer layer 51 made from $SiO_2$ having a thickness nearly equal to that of the first insulating film 21 is formed on the overall surface by the CVD process. Then, the buffer layer 51 and the semiconductor layer 30 are subjected to pattern-etching by RIE using a pattern formed by photolithography as an etching mask.

After the semiconductor layer 30 on the upper surface of which the buffer layer 51 is formed is patterned, as shown in FIGS. 12A and 12B to FIGS. 18A and 18B, the steps described with reference to FIGS. 4A and 4B to FIGS. 10A and 10B are repeated, to thus fabricate a semiconductor device.

Figures 13A, 13B:
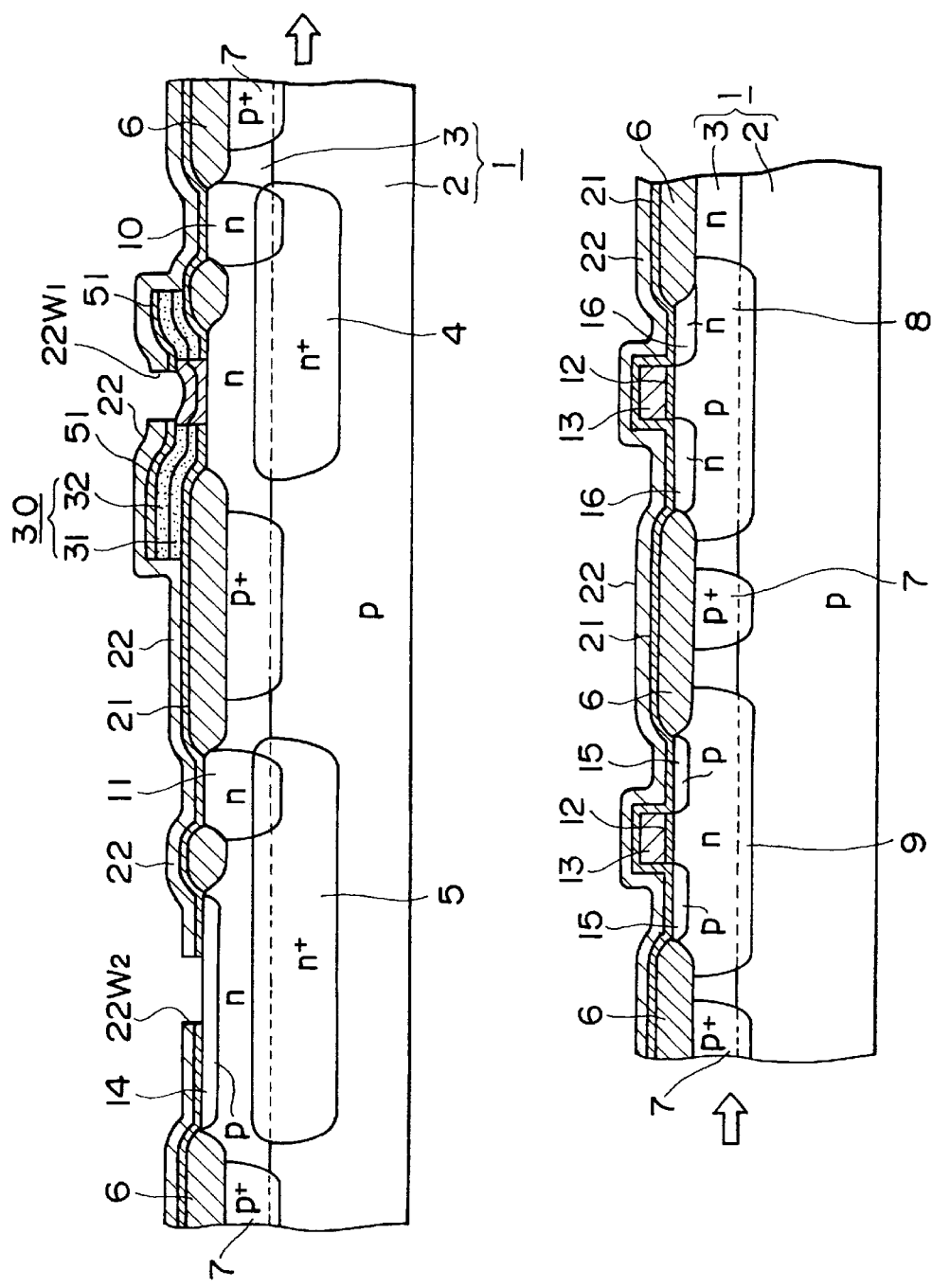
Figure 15A:
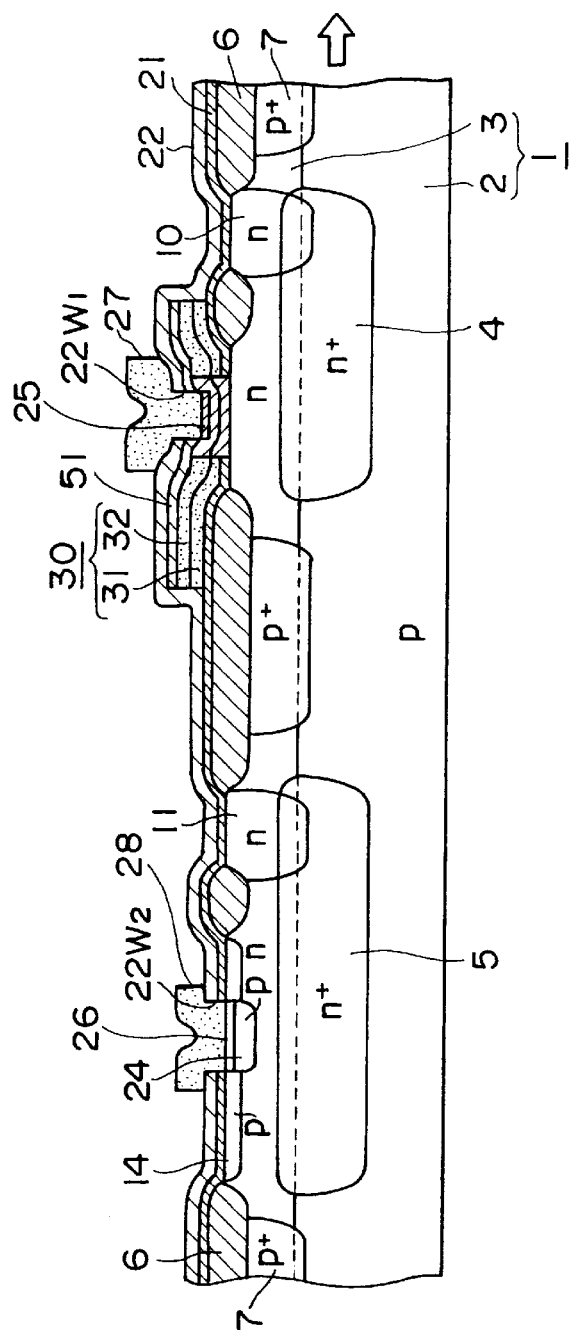
Figure 15B:
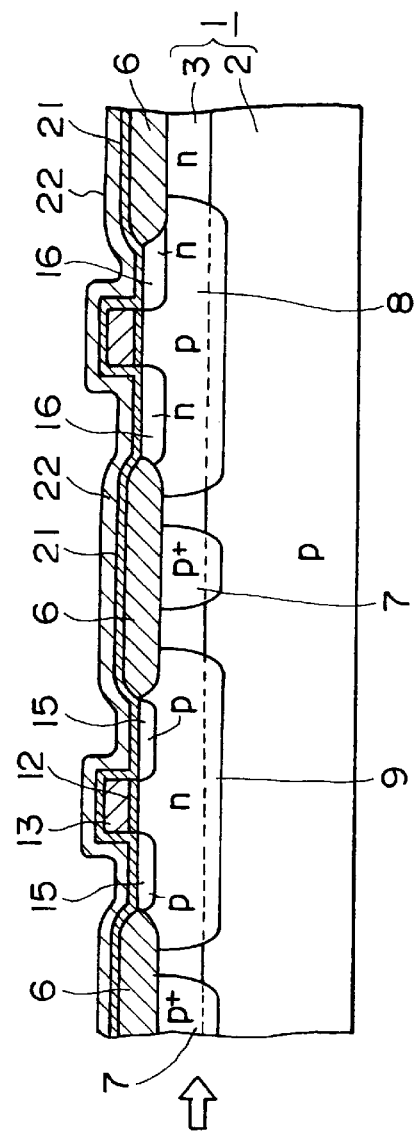

In FIGS. 12A to 12B to FIGS. 18A and 18B, parts corresponding to those shown in FIGS. 4A to 4B to FIGS. 10A and 10B are designated by the same characters and the overlapped explanation thereof is omitted. As shown in FIGS. 13A and 13B, RIE for forming first and second openings $22W_1$ and $22W_2$ is performed in the same manner as described with reference to FIGS. 5A and 5B, and in this case, since not only the second insulating film 22 but also the buffer layer 51 having the thickness equivalent to that of the first insulating film 21 are formed on the semiconductor layer 30, even if on the opening $22W_2$ side, RIE is performed to a depth equivalent to the total thickness of the first and second insulating films 21 and 22, there occurs no over-etching to a portion, under the opening $22W_1$, of the semiconductor layer 30, with a result that it is possible to avoid occurrence of the inconvenience that the second semiconductor layer 32 is cut by the RIE.

Figures 16A, 16B:
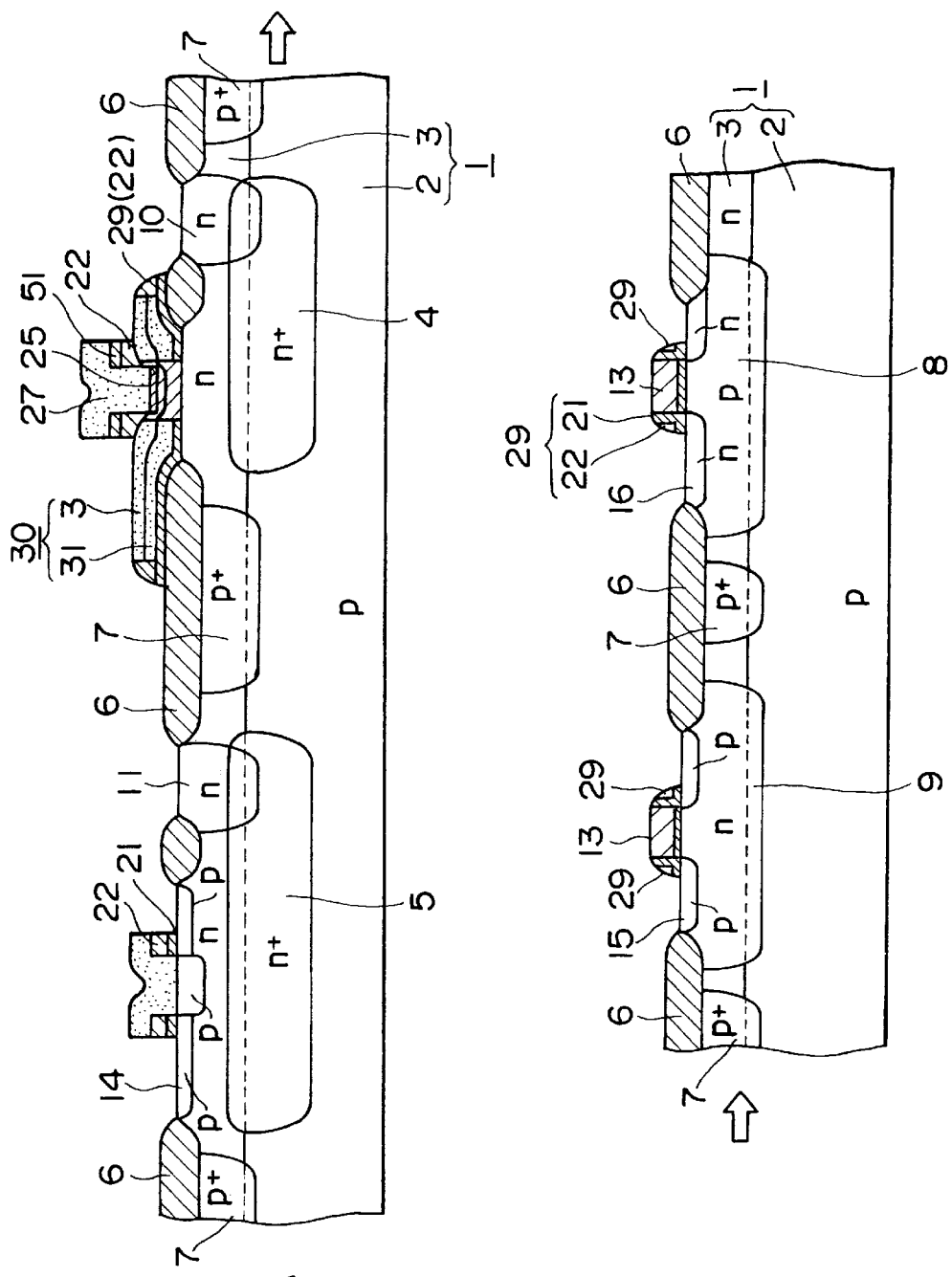

Even at the step of forming side walls 29 shown in FIGS. 16A and 16B, equivalent to FIGS. 8A and 8B, there occurs no over-etching to the semiconductor layer 30 upon performing RIE using an emitter extraction electrode 27 as a mask.

In this way, by the formation of the buffer layer 51, it is possible to solve the problem associated with over-etching to the semiconductor layer 30, and hence to avoid the degradation of the operational ability of the transistor due to partial cutting or thinning of the second semiconductor layer 32 as the upper layer of the semiconductor layer 30, and at the worst case, the occurrence of contamination of Ge, that is, so-called cross-contamination due to exposure of the first SiGe semiconductor layer as the lower layer of the semiconductor layer 30.

Even in this embodiment, like the previous embodiment described with reference to FIGS. 1A and 1B to FIGS. 10A and 10B, there can be fabricated a semiconductor device in which a first bipolar transistor $TR_1$ having the HBT configuration for high-speed operation formed by the epitaxial base technology, and a second bipolar transistor $TR_2$ having a high current amplification factor and a high withstand voltage formed by the ion implantation process are formed, that is, packaged on the common base substrate 1.

The semiconductor layer 30 constituting part of the first bipolar transistor $TR_1$ having the HBT configuration for high-speed operation is formed not by selective epitaxial technology but by overall epitaxial technology, and accordingly, the semiconductor layer can be simply fabricated. Since the portion, positioned in the operational portion 30a, of the semiconductor layer 30 is formed of the epitaxial layer having a good crystallinity directly formed on the semiconductor layer 3 of the semiconductor base substrate 1 in the opening 21W of the first insulating film 21, it is possible to fabricate the high-speed bipolar transistor having good characteristics with a high reliability.

Since most of the steps of fabricating the first bipolar transistor $TR_1$ having the HBT configuration, the second bipolar transistor $TR_2$ having the usual configuration, the n-channel MOS transistor, and the p-channel MOS transistor on the common base substrate are common to each other, it is possible to reduce the number of the fabrication steps. For example, the doping of the impurity in the SiGe semiconductor layer 31 for formation of a base extraction electrode 40 of the first bipolar transistor $TR_1$ having the HBT configuration and the doping of the impurity for forming source/drain regions 35 of the pMOS are performed at the same step, and also the emitter formation step in the first bipolar transistor $TR_1$ is common to the emitter formation step in the second bipolar transistor $TR_2$, and accordingly, it is possible to simplify the fabrication steps, and hence to enhance the mass-productivity and reduce the fabrication cost.

Even in this embodiment, the insulating film for forming the side walls in each of the n-channel and p-channel MOS transistors is divided into the first and second insulating films 21 and 22, and the semiconductor layer 30, that is, an intrinsic base region 31a constituting part of the first bipolar transistor $TR_1$ having the HBT configuration is formed between the first and second insulating films 21 and 22 and the base extraction electrode 40 is formed by ion implantation with the emitter extraction electrode 27 taken as a mask, and accordingly, it is possible to make smaller the vertical step in the transistor $TR_1$. As a result, since the bipolar transistor $TR_1$ can be performed simultaneously with the usual CMOS formation step without the need of any complicated interconnection step and the like, it is possible to avoid the increase in fabrication cost.

In the embodiments described with reference to FIGS. 1A and 1B to FIGS. 18A and 18B, the first and second bipolar transistor and the CMOS are formed on the common semiconductor base substrate 1; however, the present invention is not limited thereto and may be applied to a semiconductor device having a basic structure including an LDD type n-channel or p-channel MOS transistor and the above-described first bipolar transistor $TR_1$, and may be of course applied to a semiconductor device in which a plurality of the above basic structures and other circuit elements are formed on a common semiconductor base substrate.

While the preferred embodiments of the present invention have been described using the specific terms, such description is for illustrative purposes only, and it is to be understood that changes and variations may be made without departing from the spirit or scope of the following claims.

What is claimed is:

1. A method of fabricating a semiconductor device in which a bipolar transistor and a field effect transistor are formed on a common base substrate, comprising the steps of:

forming first source and drain regions and a gate electrode of said field effect transistor;

forming a first insulating film on said base substrate;

forming an opening in said first insulating film at a position over an operational region of said bipolar transistor;

forming a semiconductor layer as a single crystal semiconductor layer on the surface of said base substrate exposed from said opening and as a polycrystalline semiconductor layer on said first insulating film;

processing said semiconductor layer;

forming a second insulating film on said semiconductor layer and on a region of said field effect transistor;

forming side walls on the side surfaces of said gate electrode by etching said first and second insulating films; and forming second source and drain regions by doping an impurity with said gate electrode and said side walls as a mask.

2. A method of fabricating a semiconductor device according to claim 1, wherein said single crystal semiconductor layer forms a base region of said bipolar transistor and said polycrystalline semiconductor layer forms a base extraction region of said bipolar transistor.

3. A method of fabricating a semiconductor device according to claim 1, wherein at said step of forming second source and drain regions by doping an impurity, said impurity is simultaneously doped in said polycrystalline semiconductor layer to form a base extraction electrode.

4. A method of fabricating a semiconductor device according to claim 1, further comprising the step of forming a third insulating film having a thickness nearly equal to that of said first insulating film between said semiconductor layer and said second insulating film.

5. A method of fabricating a semiconductor device according to claim 1, further comprising the step of forming an element isolation layer for isolating said bipolar transistor from said field effect transistor, and a well region including said first and second source and drain regions of said field effect transistor by the same impurity doping step.

6. A method of fabricating a semiconductor device according to claim 1, wherein the impurity concentration of said second source and drain regions is higher than that of said first source and drain regions.

7. A method of fabricating a semiconductor device in which first and second bipolar transistors different in characteristic from each other and a field effect transistor are formed on a common base substrate, comprising the steps of:

forming first source and drain regions and a gate electrode of said field effect transistor;

forming a first insulating film on said base substrate;

forming an opening in said first insulating film at a position over an operational region of said first bipolar transistor;

forming a semiconductor layer as a single crystal semiconductor layer on the surface of said base substrate exposed from said opening and as a polycrystalline semiconductor layer on said first insulating film;

processing said semiconductor layer;

forming a second insulating film on said semiconductor layer, on a region of said second bipolar transistor, and on a region of said field effect transistor;

forming side walls on the side surfaces of said gateelectrode by etching said first and second insulating films; and forming second source and drain regions by doping an impurity with said gate electrode and said side walls as a mask.

8. A method of fabricating a semiconductor device according to claim 7, wherein said single crystal semiconductor layer forms a base region of said first bipolar transistor and said polycrystalline semiconductor layer forms a base extraction region of said first bipolar transistor.

9. A method of fabricating a semiconductor device according to claim 7, wherein at said step of forming second source and drain regions by doping an impurity, said impurity is simultaneously doped in said polycrystalline semiconductor layer to form a base extraction electrode.

10. A method of fabricating a semiconductor device according to claim 7, further comprising the step of forming a third insulating film having a thickness nearly equal to that of said first insulating film between said semiconductor layer and said second insulating film.

11. A method of fabricating a semiconductor device according to claim 7, further comprising the step of forming element isolation layers for isolating said first and second bipolar transistor and said field effect transistor from each other, and a well region including said first and second source and drain regions of said field effect transistor by the same impurity doping step.

12. A method of fabricating a semiconductor device according to claim 7, wherein the impurity concentration of said second source and drain regions is higher than that of said first source and drain regions.

13. A method of fabricating a semiconductor device according to claim 7, further comprising the step of forming collector extraction regions of said first and second bipolar transistors, and a well region including said first and second source and drain regions of said field effect transistor by the same impurity doping step.

14. A method of fabricating a semiconductor device according to claim 7, further comprising the step of forming emitter electrodes of said first and second bipolar transistors by the same step.

15. A method of fabricating a semiconductor device according to claim 7, wherein at said step of forming second source and drain regions by doping an impurity, said impurity is simultaneously doped in said second bipolar transistor portion and said polycrystalline semiconductor layer of said first bipolar transistor to form a graft base region for extracting an intrinsic base region of said second bipolar transistor and a base extraction electrode of said first bipolar transistor, respectively.

16. A method of fabricating a semiconductor device according to claim 15, wherein said first source and drain regions and a link base region for connecting said intrinsic base region of said second bipolar transistor to said graft base region are formed by the same impurity doping step.

17. A method of fabricating a semiconductor device in which a first bipolar transistor including a base region formed by epitaxial growth, a second bipolar transistor including a base region formed by ion implantation, a first field effect transistor having a first conductive type channel, and a second field effect transistor having a second conductive type channel, comprising the steps of:

forming gate insulating films and gate electrodes of said first and second field effect transistors by the same step;

forming first source and second regions of said first and second field effect transistors using said gate electrode as a mask;

forming a first insulating film on said base substrate;

forming an opening in said first insulating film at a position over an operational region of said first bipolar transistor;

forming a semiconductor layer as a single crystal semiconductor layer on the surface of said base substrate exposed from said opening and as a polycrystalline semiconductor layer on said first insulating film;

processing said semiconductor layer;

forming a second insulating film on said semiconductor layer, on a region of said second bipolar transistor, and on regions of said first and second field effect transistors;

forming side walls on the side surfaces of said gate electrode of each of said first and second field effect transistors by etching said first and second insulating films; and forming second source and drain regions of each of said first and second field effect transistors by doping an impurity using said gate electrode and said side walls as a mask.

18. A method of fabricating a semiconductor device according to claim 17, wherein the impurity concentration of said second source and drain regions of each of said first and second field effect transistors is higher than that of said first source and drain regions of each of said first and second field effect transistors.

19. A method of fabricating a semiconductor device according to claim 17, further comprising the step of forming collector extraction regions of said first and second bipolar transistors, and a well region including said first and second source and drain regions of said first field effect transistor by the same impurity doping step.

20. A method of fabricating a semiconductor device according to claim 17, wherein at said step of forming second source and drain regions of said first field effect transistor by doping an impurity, said impurity is simultaneously doped in said second bipolar transistor portion and said polycrystalline semiconductor layer of said first bipolar transistor to form a graft base region for extracting an intrinsic base region of said second bipolar transistor and a base extraction electrode of said first bipolar transistor, respectively; and said first source and drain regions of said first field effect transistor and a link base region for connecting said intrinsic base region of said second bipolar transistor to said graft base region are formed by the same impurity doping step.

* * * * *